United States Patent [19]

Sakui et al.

[11] Patent Number: 5,453,955

[45] Date of Patent: Sep. 26, 1995

[54] NON-VOLATILE SEMICONDUCTOR MEMORY DEVICE

[75] Inventors: Koji Sakui, Tokyo; Hiroshi Nakamura; Masaki Momodomi, both of Yokohama; Riichiro Shirota, Kawasaki; Fujio Masuoka, Yokohama, all of Japan

[73] Assignee: Kabushiki Kaisha Toshiba, Kawasaki, Japan

[21] Appl. No.: 255,904

[22] Filed: Jun. 7, 1994

Related U.S. Application Data

[63] Continuation of Ser. No. 845,582, Mar. 4, 1992, abandoned.

[30] Foreign Application Priority Data

Mar. 4, 1991 [JP] Japan ............................ 3-062574

[51] Int. Cl.$^6$ ........................................ G11C 7/00
[52] U.S. Cl. .................... 365/203; 365/204; 365/233.5
[58] Field of Search ................................... 365/203, 233, 365/233.5, 190, 204

[56] References Cited

U.S. PATENT DOCUMENTS

| | | | |
|---|---|---|---|
| 4,612,631 | 9/1986 | Ochii | 365/203 |
| 4,730,279 | 3/1988 | Ohtani | 365/203 |
| 4,980,861 | 12/1990 | Herdt et al. | 365/203 |

FOREIGN PATENT DOCUMENTS

| | | |
|---|---|---|
| 0018774 | 11/1980 | European Pat. Off. . |
| 3207485 | 9/1982 | Germany . |
| 61-160894 | 7/1986 | Japan . |
| 1-140496 | 6/1989 | Japan . |

OTHER PUBLICATIONS

4-Mbit NAND-EEPROM, Ryouhei Kirisawa, et al., pp. 997-1000.
4-Mbit NAND-EEPROM with Tight Programmed VT Distribution, Tomoharu Tanaka, et al., pp. 105-106.

*Primary Examiner*—Joseph A. Popek
*Attorney, Agent, or Firm*—Oblon, Spivak, McClelland, Maier & Neustadt

[57] ABSTRACT

A non-volatile semiconductor memory device includes read charging transistors for setting bit lines at a predetermined read potential to perform a data read operation, and read discharging transistors for setting non-selected bit lines at the ground potential during the read operation. These transistors are controlled by different control signals, obtained by detecting an address change, for every other bit line in accordance with an input address so that the read discharging transistors are kept ON to set the non-selected bit lines at the ground potential before and during the data read operation.

11 Claims, 23 Drawing Sheets

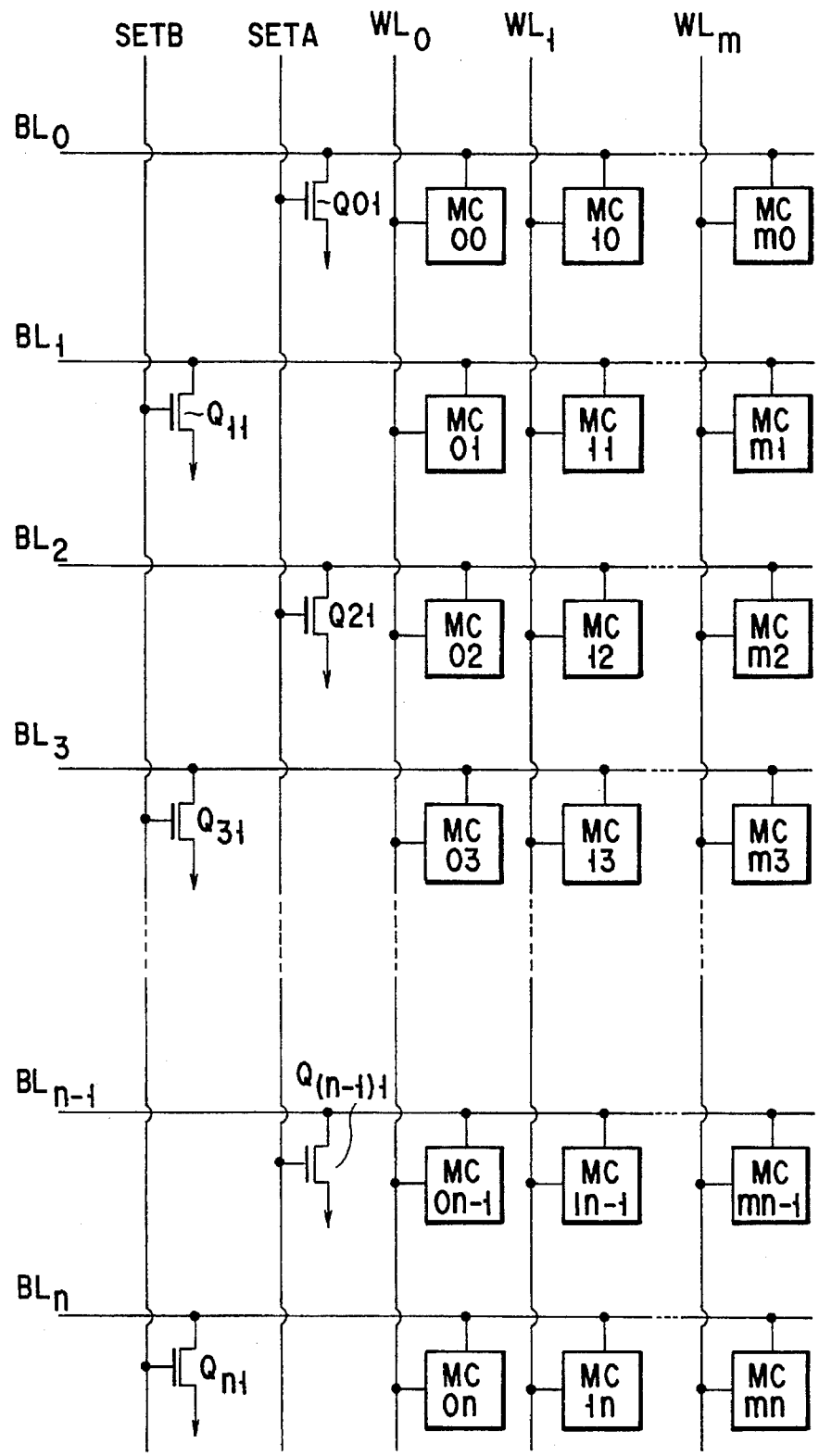
F I G. 1

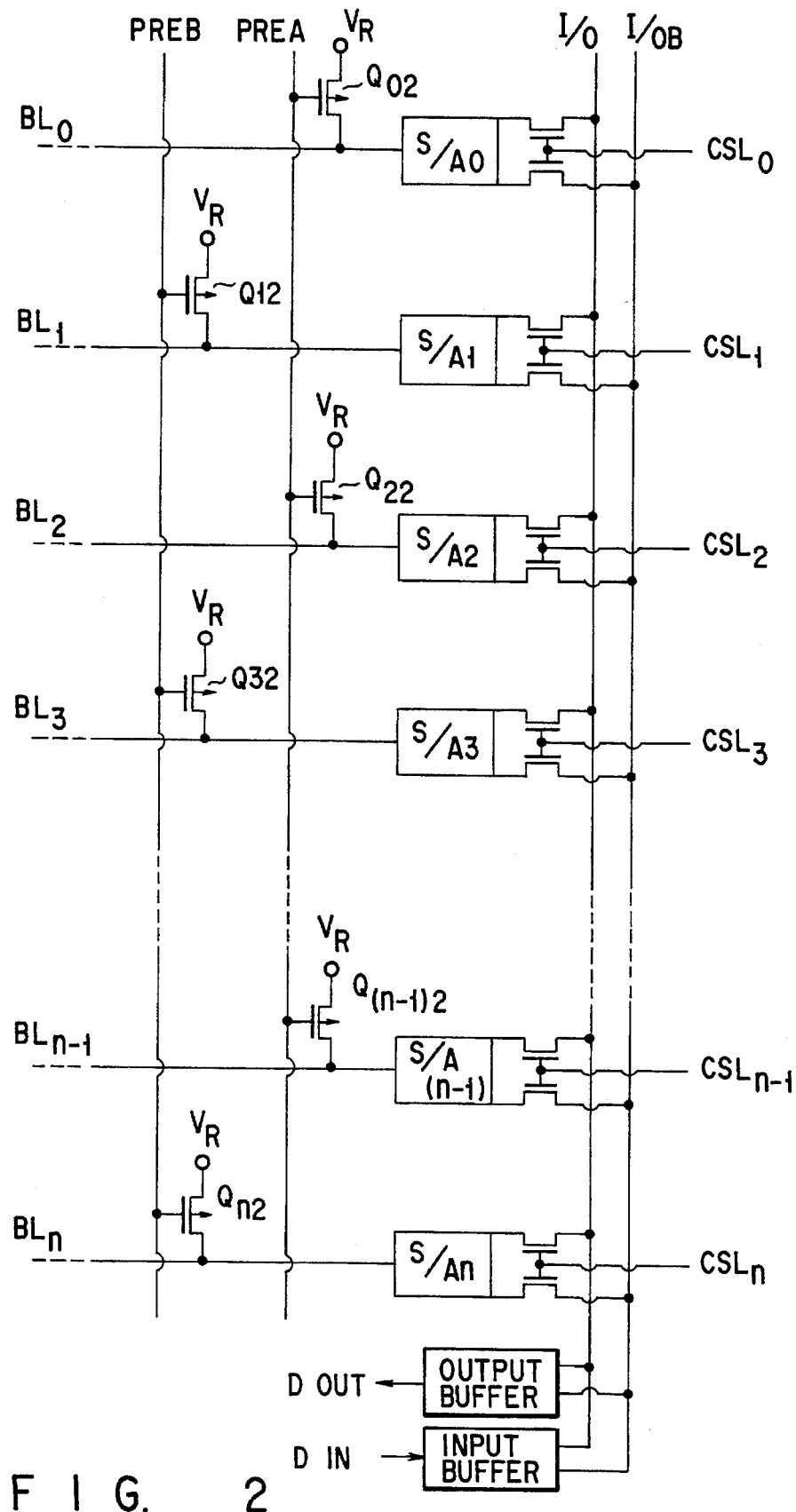
F I G. 2

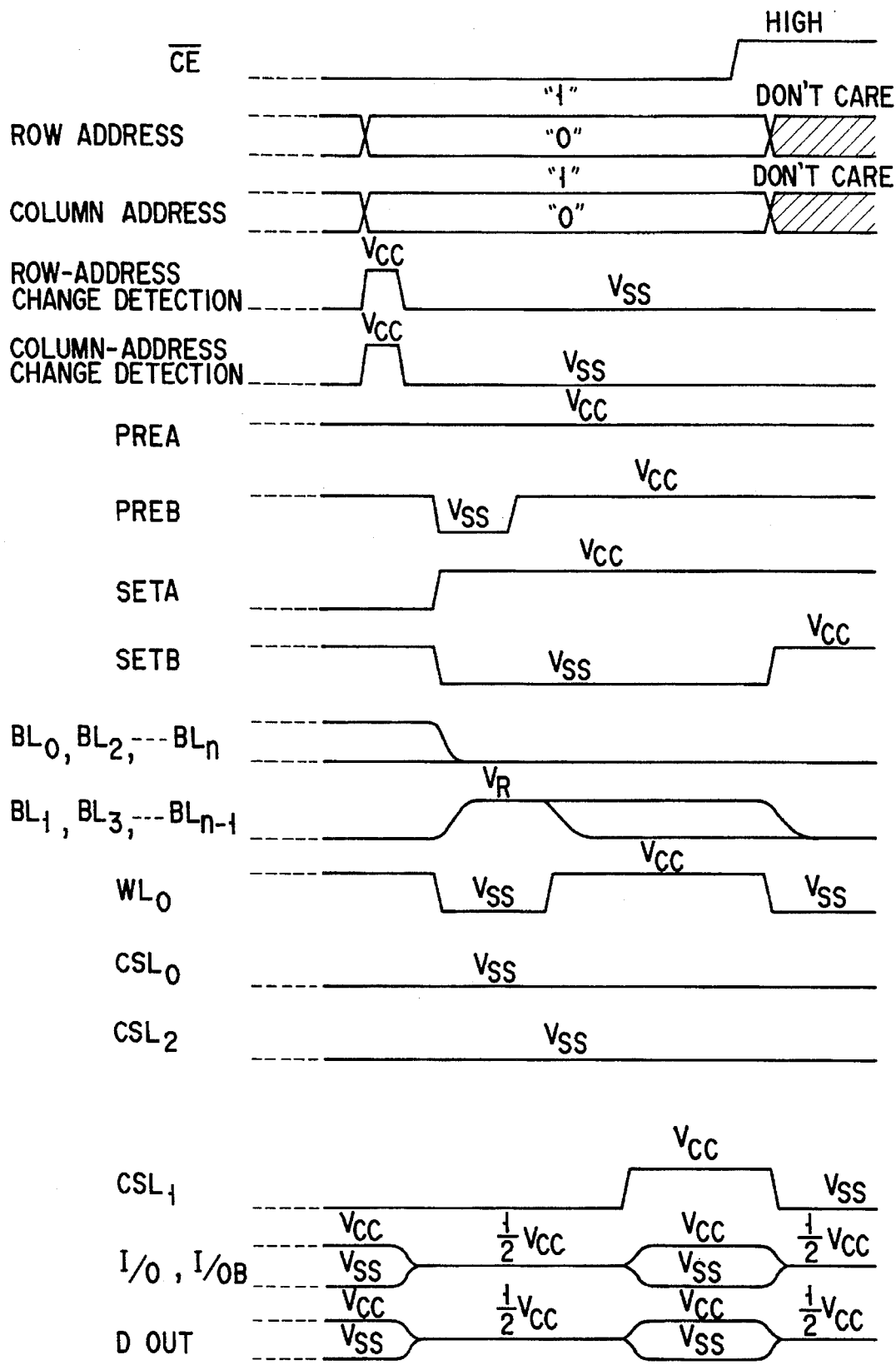
F I G. 4

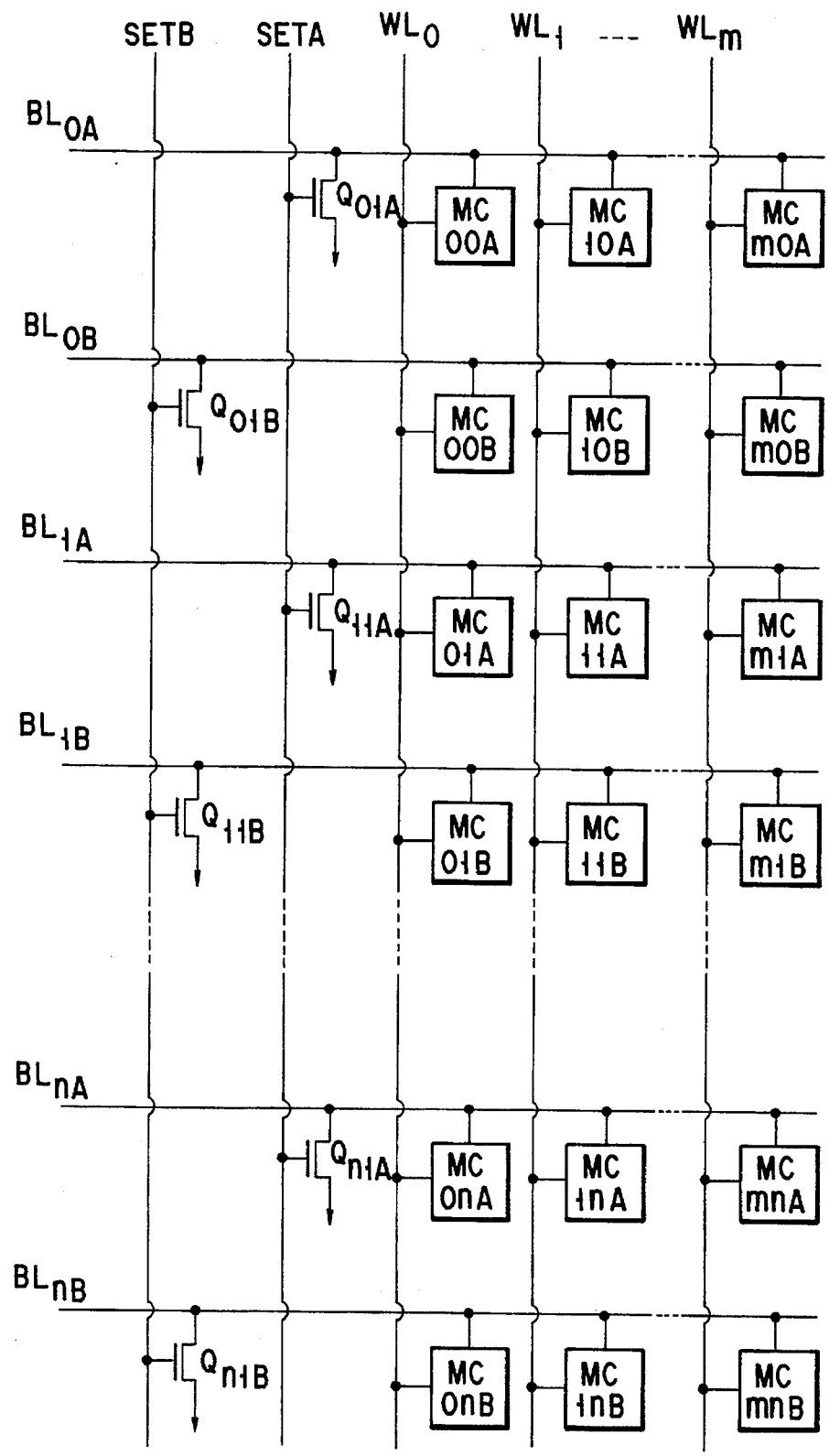
F I G. 5

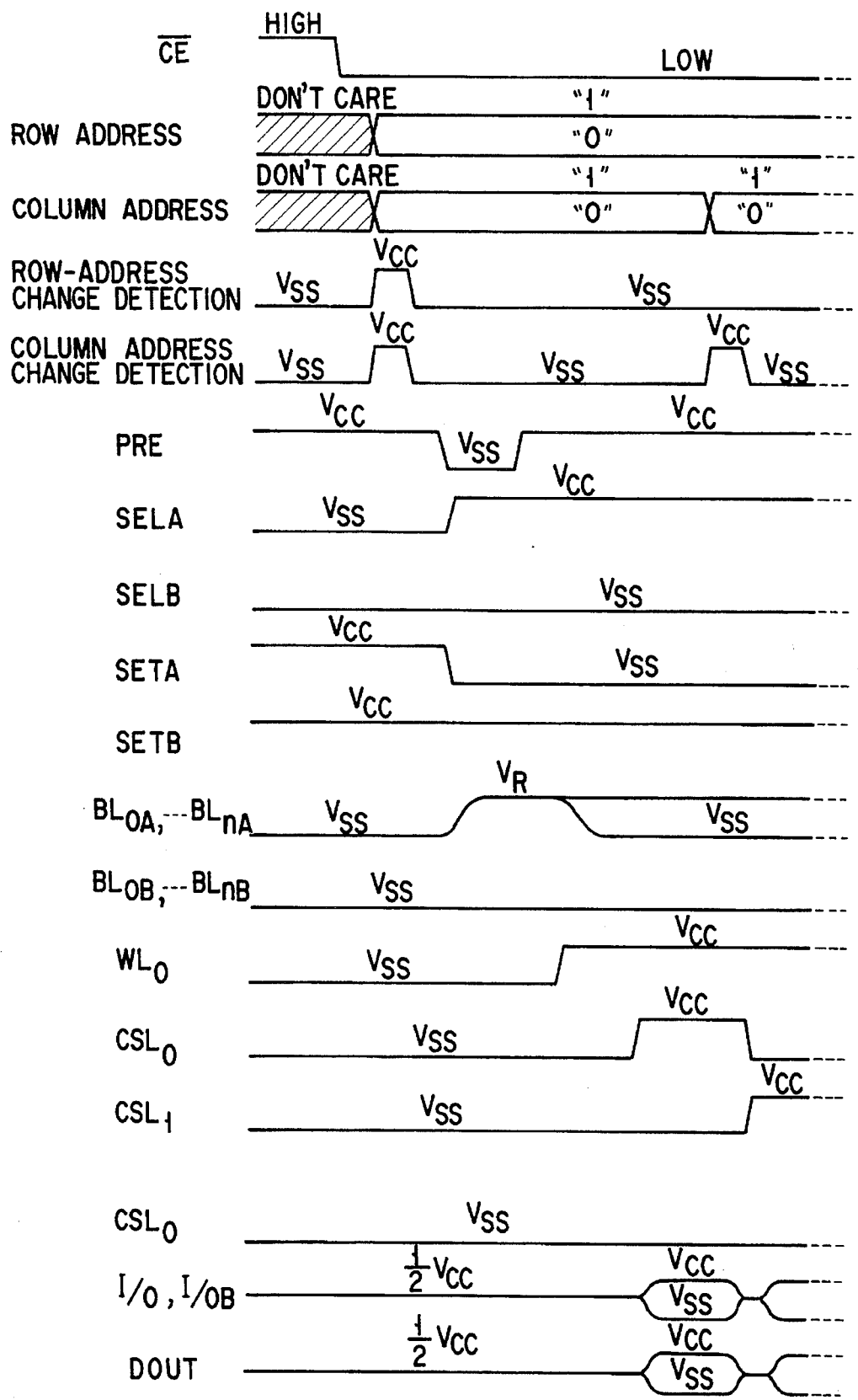
F I G. 7

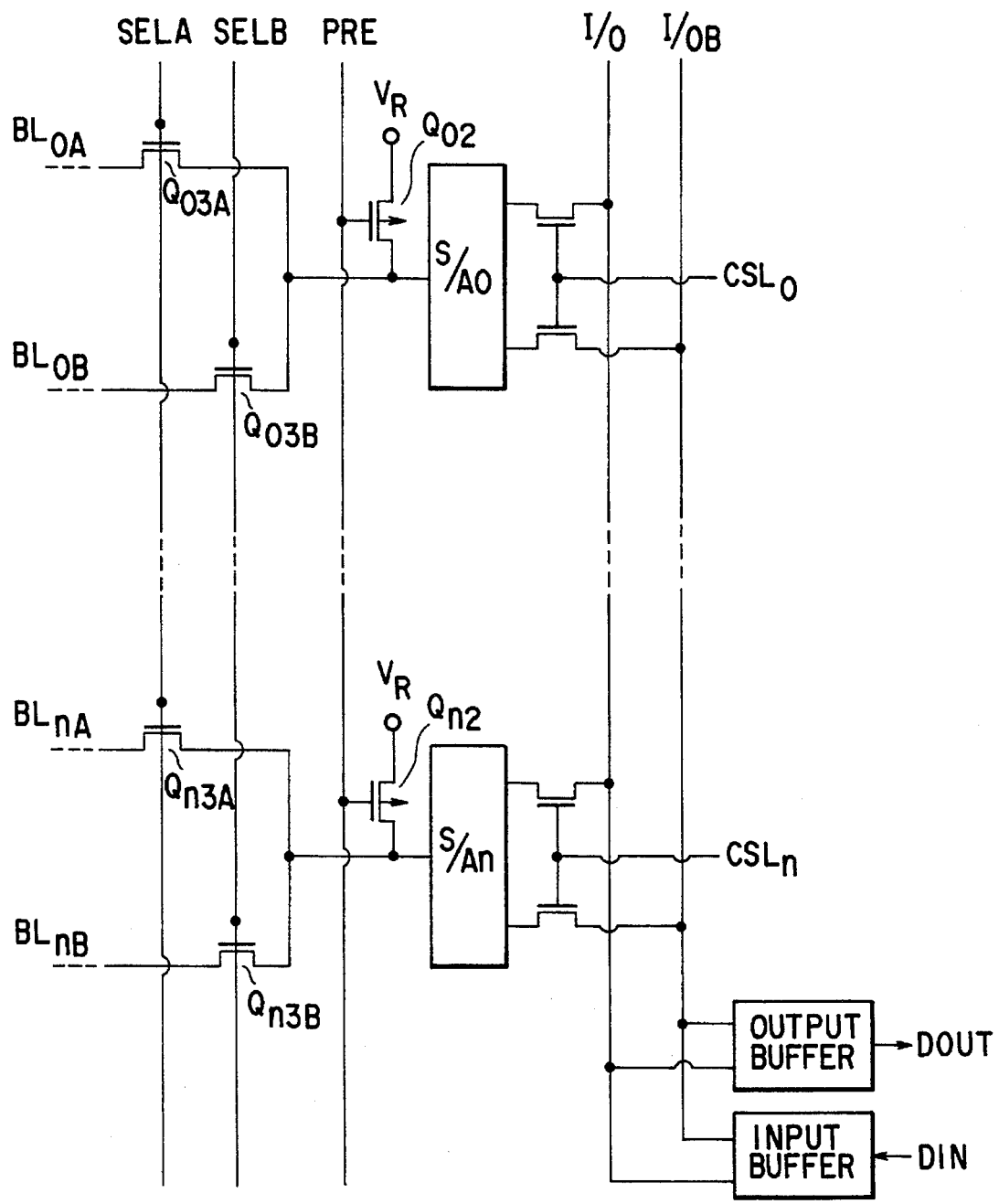
F I G. 10

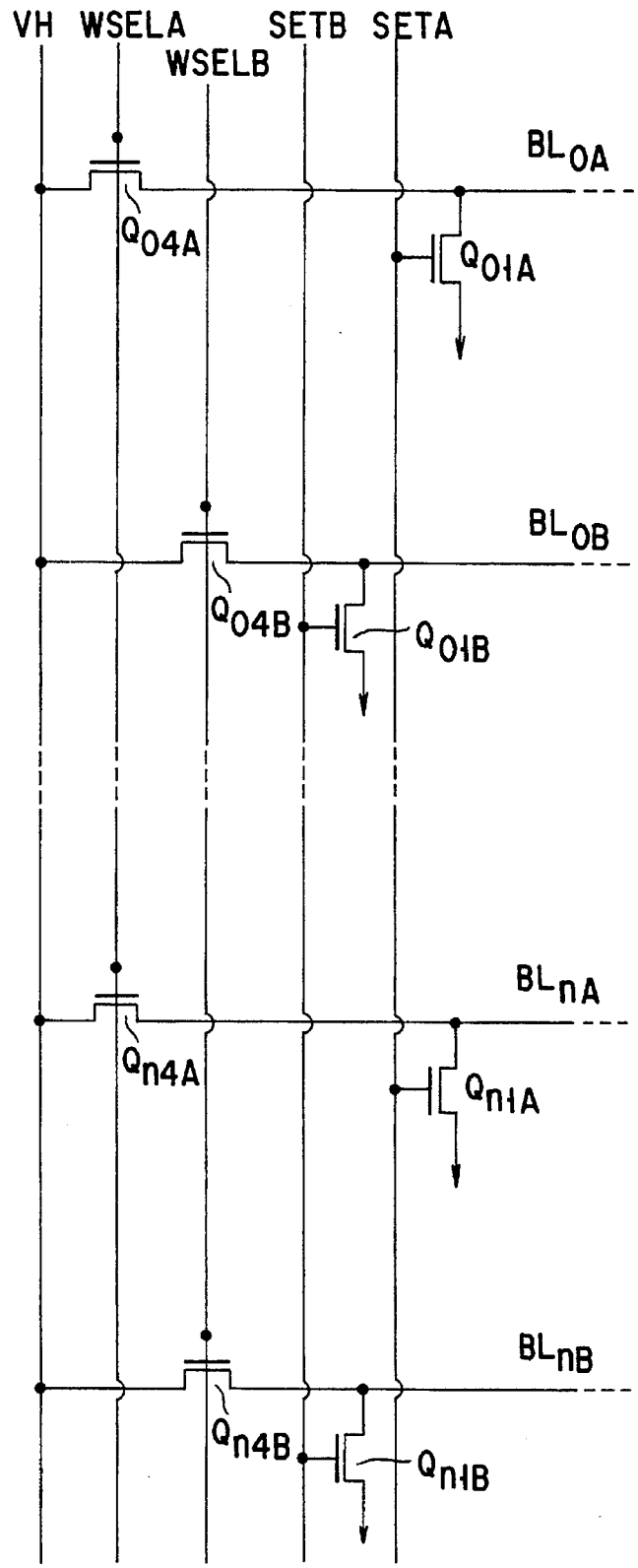
F I G. 13

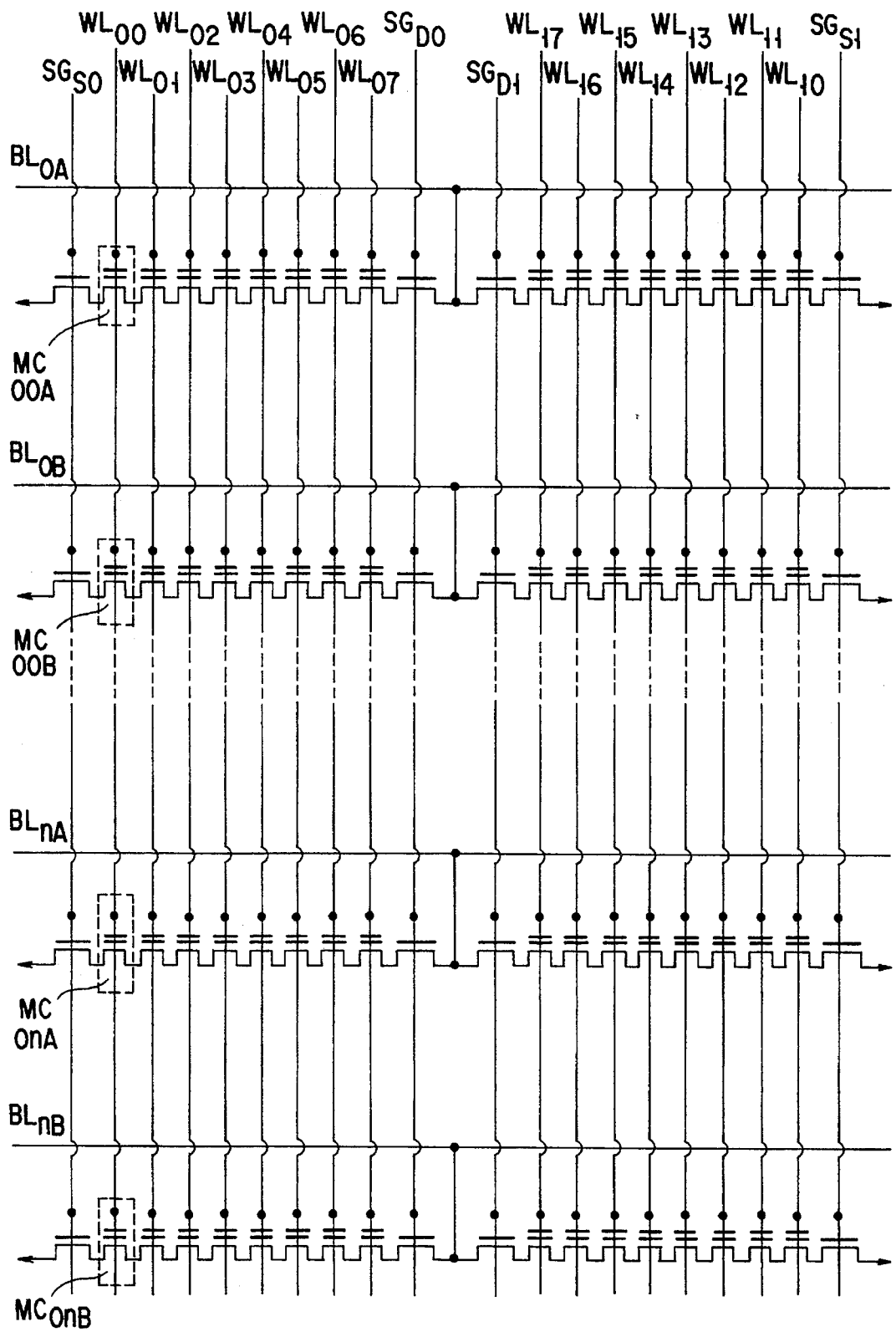
F I G. 14

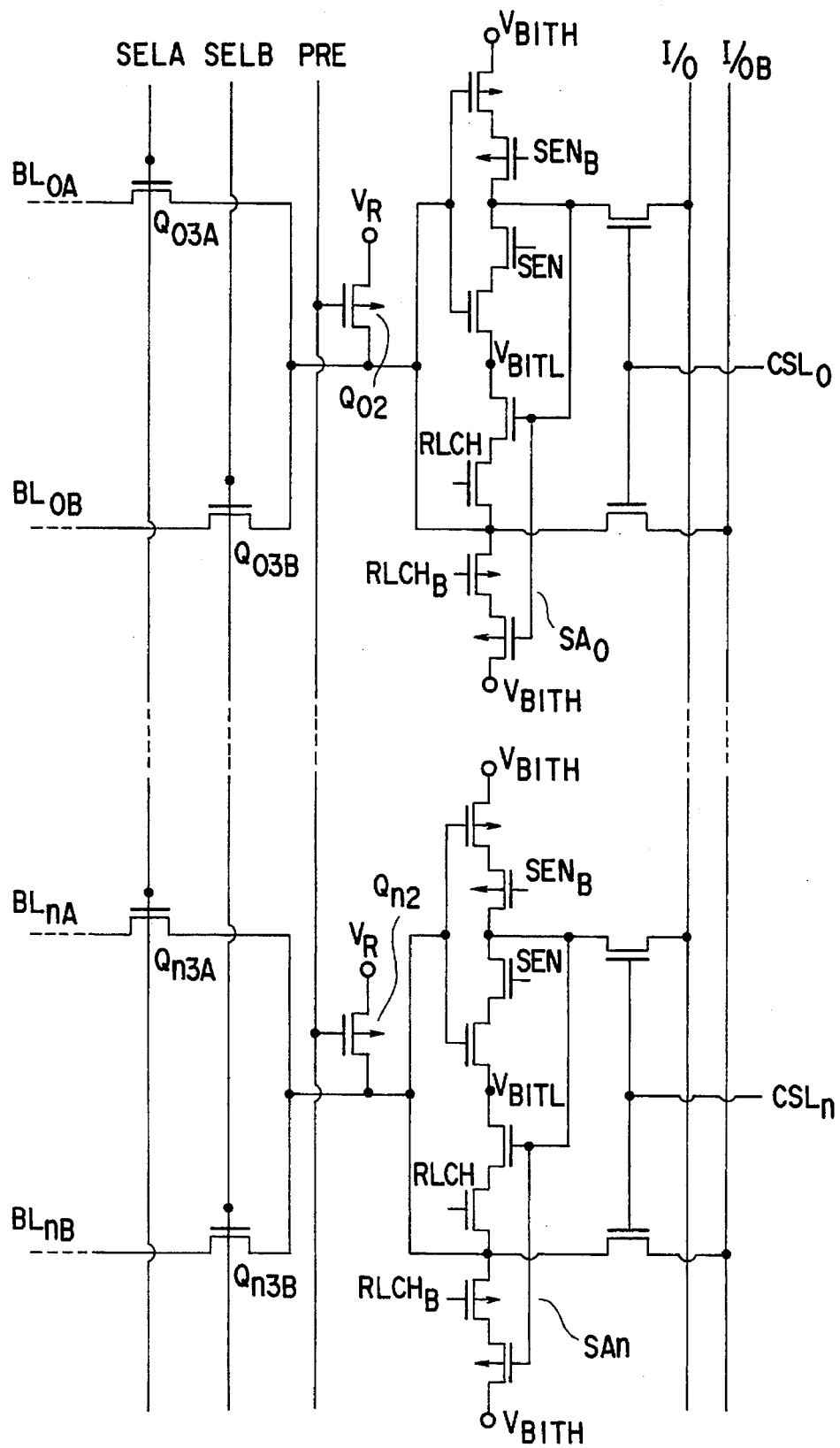
F I G. 15

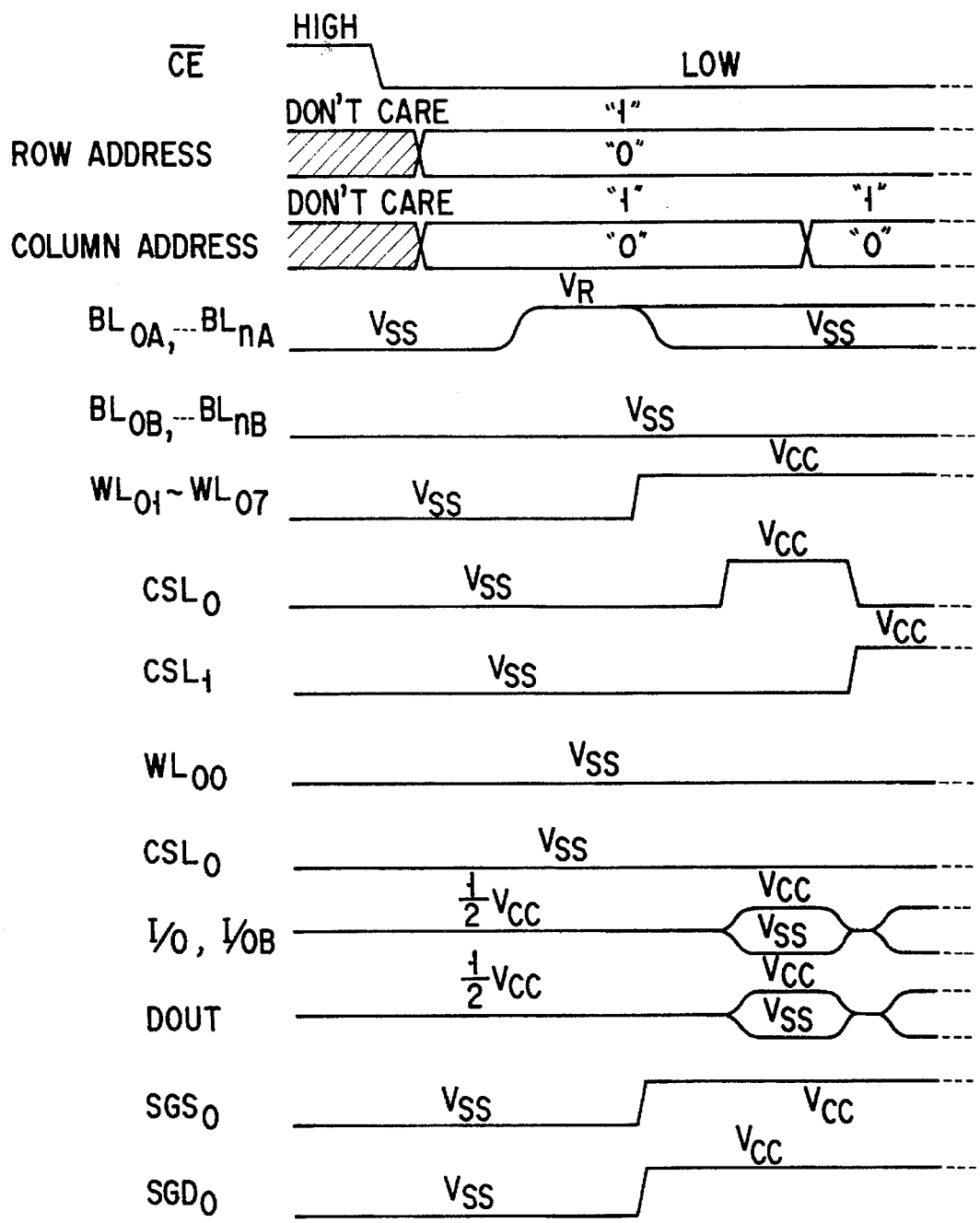
F I G. 17

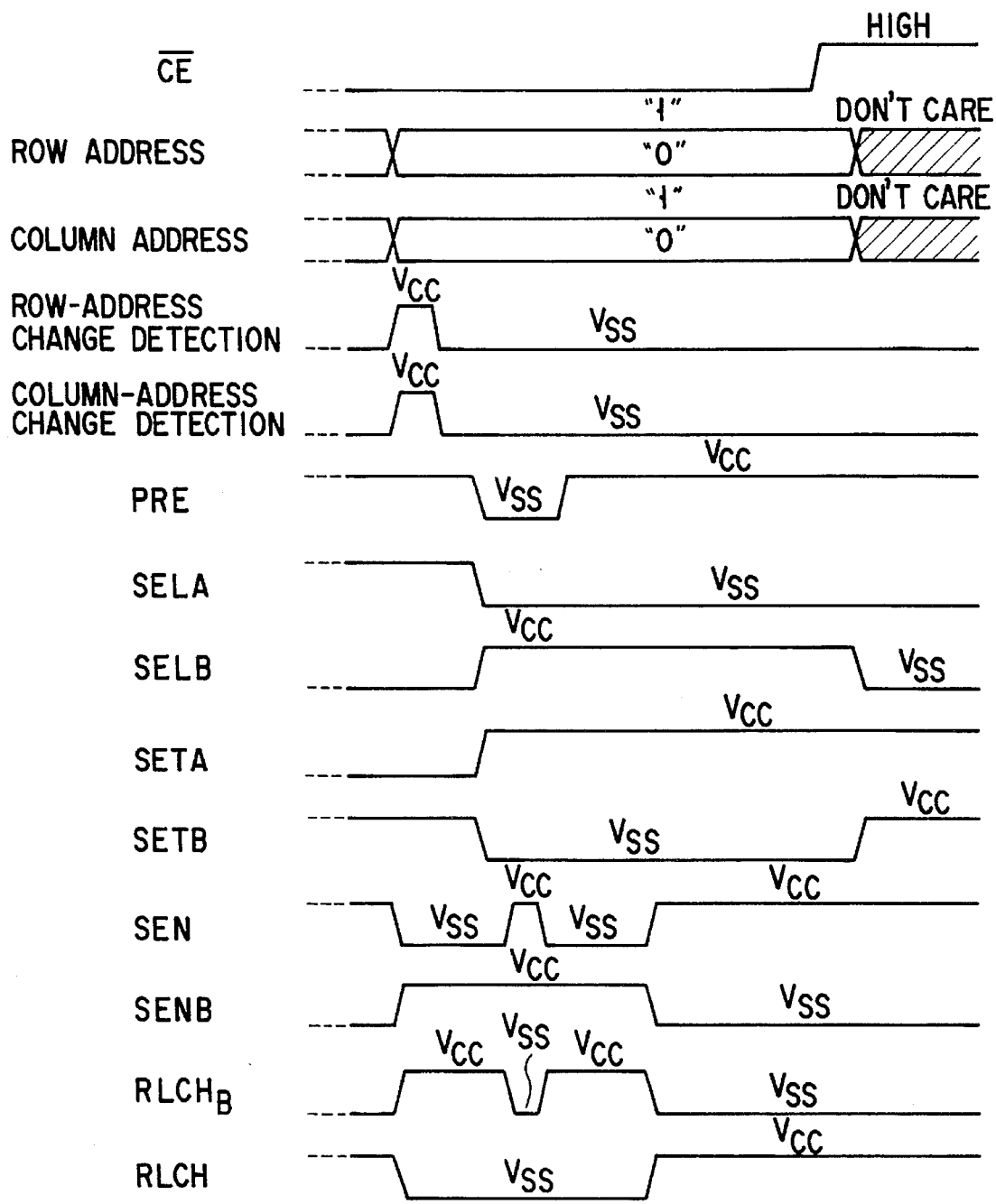
F I G. 18

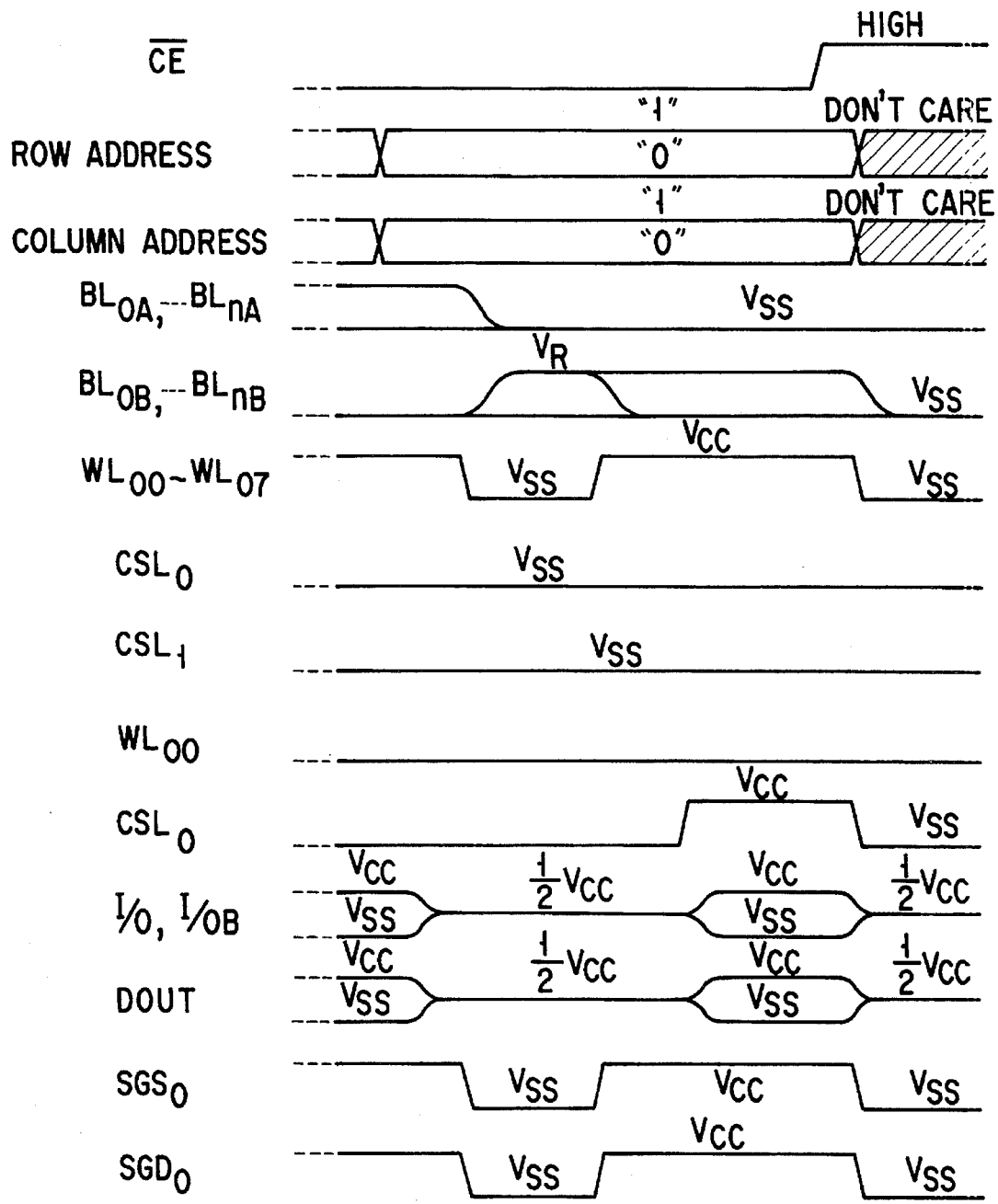
F I G. 19

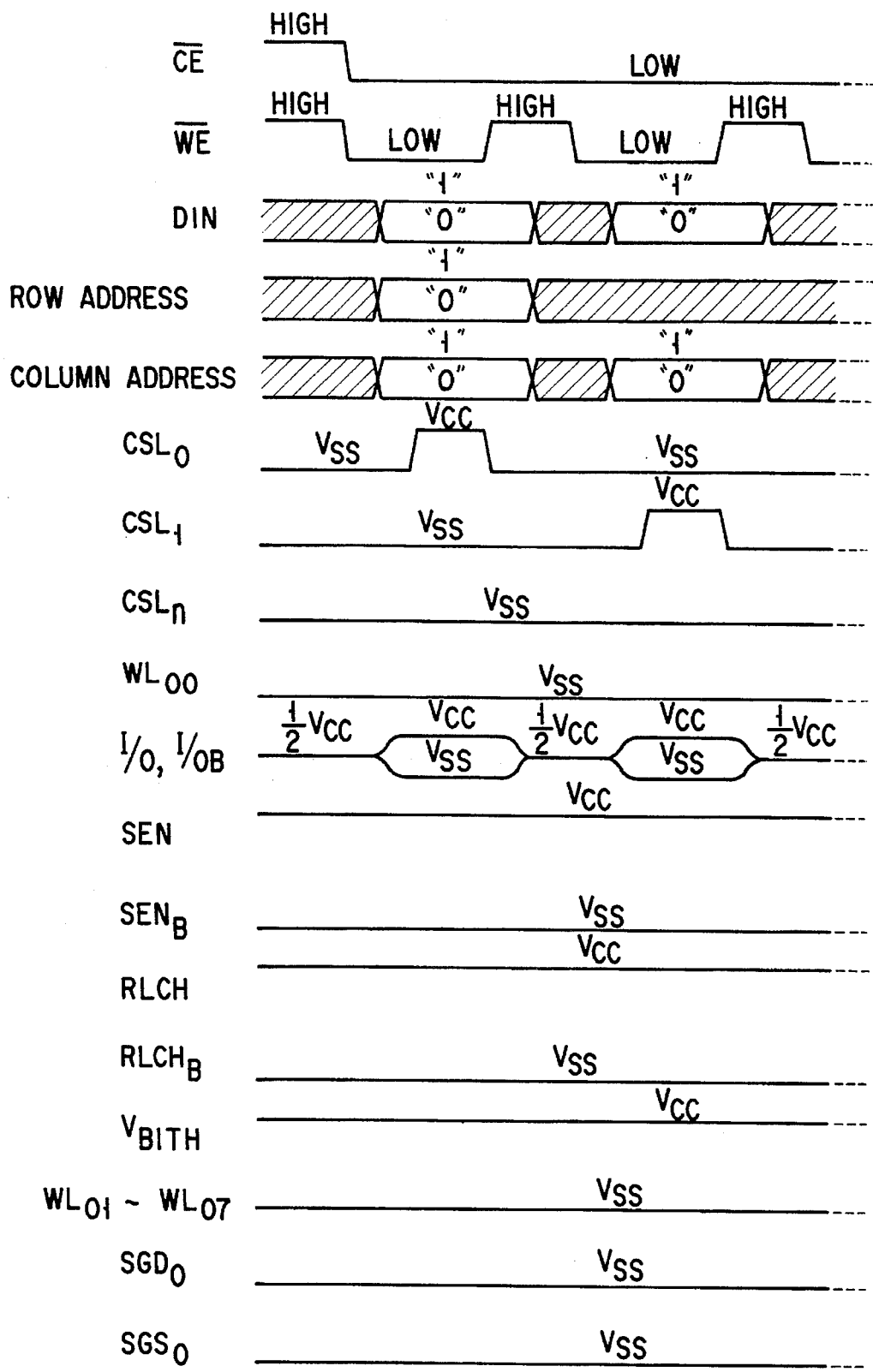
F I G. 21

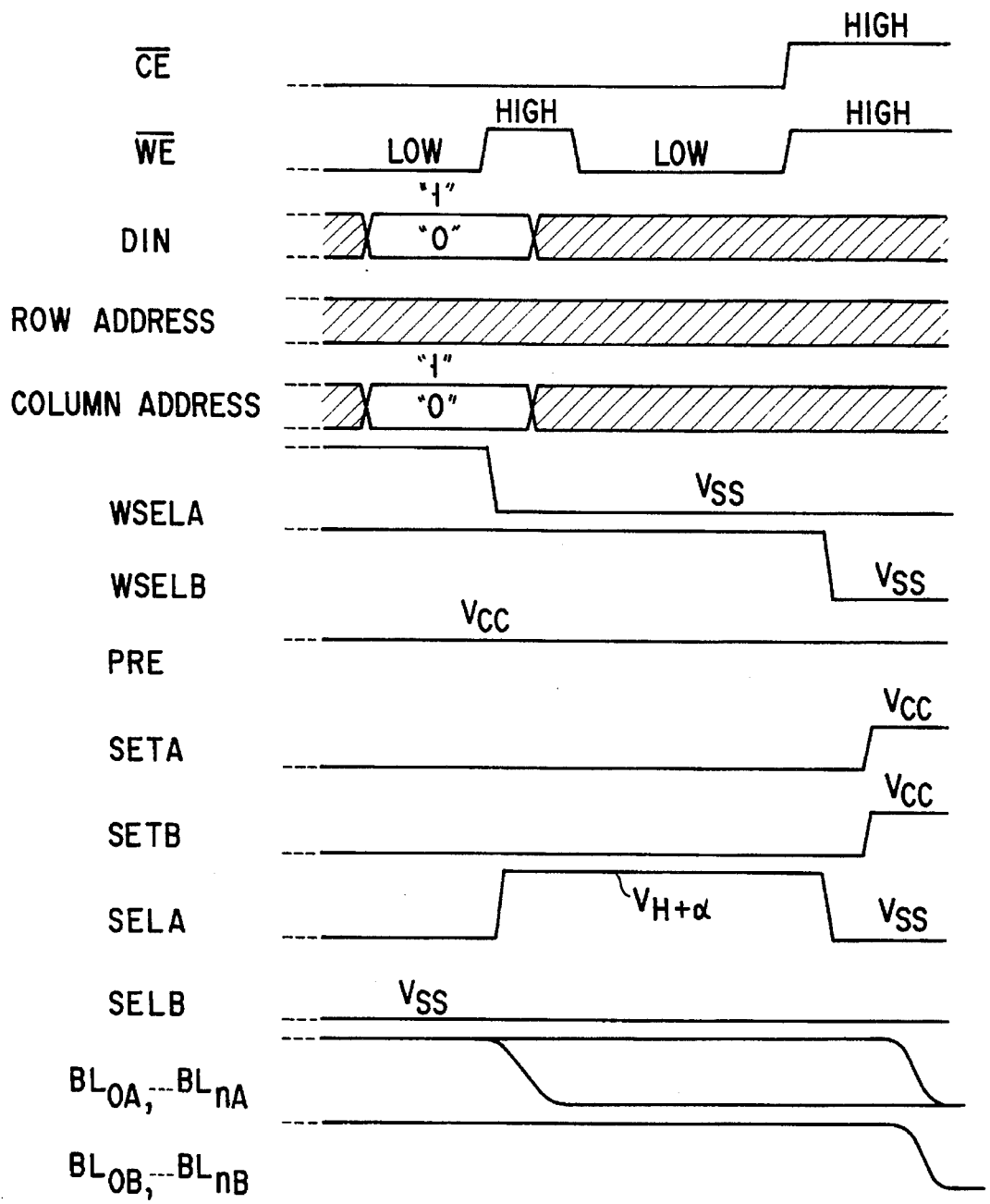
F I G. 22

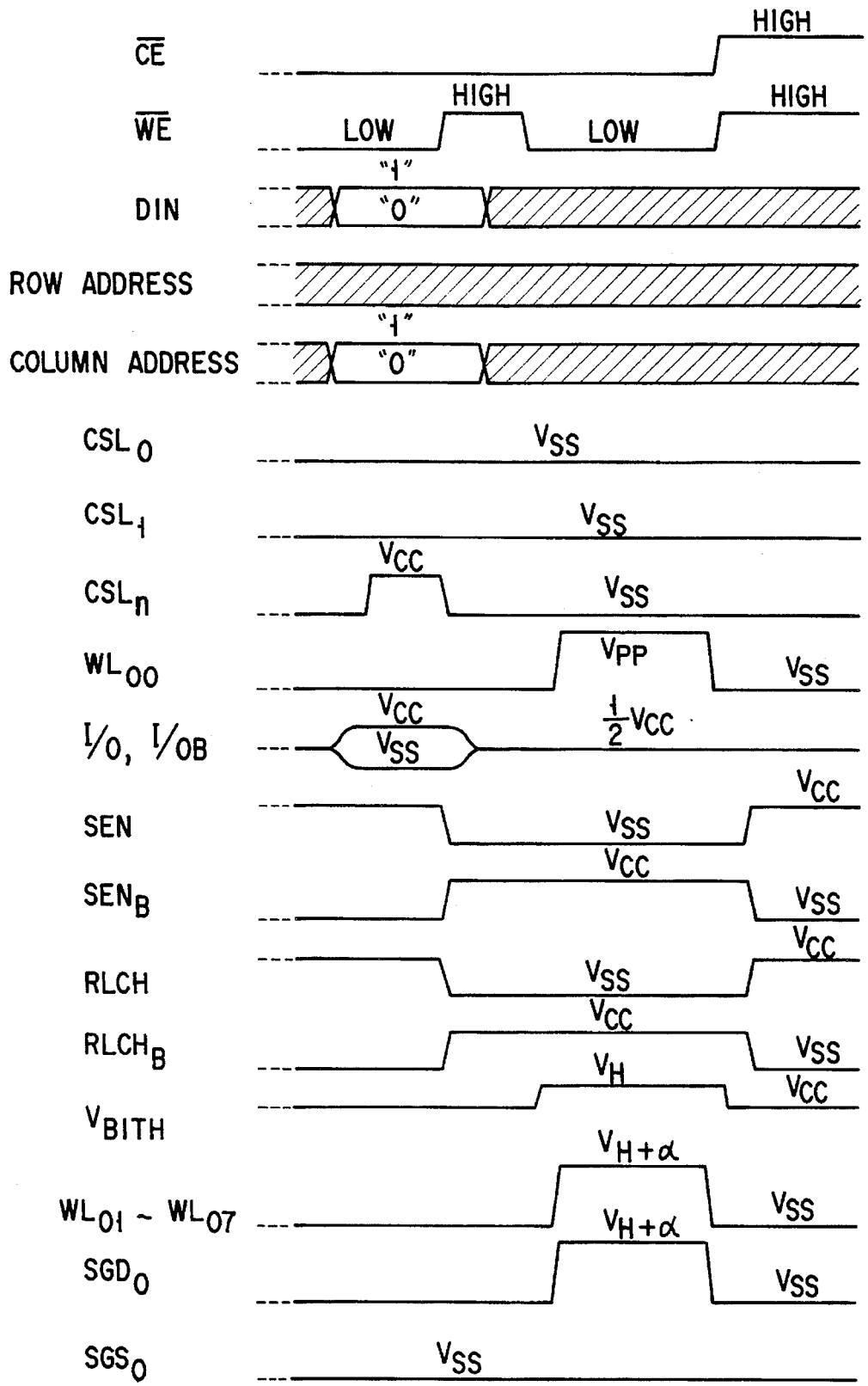
F I G. 23

NON-VOLATILE SEMICONDUCTOR MEMORY DEVICE

This application is a continuation of application Ser. No. 07/845,582, filed on Mar. 4, 1992, now abandoned.

BACKGROUND OF THE INVENTION

1. Field of the Invention

The present invention relates to an erasable programmable non-volatile semiconductor memory device.

2. Description of the Related Art

As conventional erasable programmable non-volatile semiconductor memory devices, EEPROMs (electrically erasable programmable read only memories) are known. Of these conventional memory devices, a great deal of attention is especially paid to a NAND-structured cell EEPROM as an EEPROM which can contribute to an increase in packing density. In the NAND-structured cell type EEPROM, a plurality of memory cells are connected in series to constitute a NAND-structured cell block. Each memory cell of the NAND-cell type EEPROM includes an FETMOS structure having a floating gate and a control gate which are insulatively stacked on a semiconductor substrate. A plurality of memory cells are connected in series such that adjacent memory cells share sources and drains, thereby constituting a NAND cell. Such NAND cells are arranged in the form of a matrix to constitute a memory cell array. The drains on one end sides of NAND cells aligned in the column direction of the memory cell array are commonly connected to a bit line through selection gate transistors, while the sources on the other end sides thereof are connected to a common source line through selection gate transistors. The control gates of the memory transistors and the gate electrodes of the selection gate transistors are commonly connected in the row direction of the memory cell array to constitute control gate lines (word lines) and selection gate lines, respectively.

An operation of the NAND cell type EEPROM will be described below.

A data write operation is sequentially performed with respect to memory cells, starting from the memory cell located farthest from a bit line. Assume that the NAND cell type EEPROM has n channels. In this case, a high potential (e.g., 20 V) is applied to the control gate of a selected memory cell, and an intermediate potential (e.g., 10 V) is applied to the control gates of the non-selected memory cells and the gate of the selection gate transistor which are located closer to the bit line than the selected memory cell. In accordance with data, 0 V (for, e.g., "1" data) or an intermediate potential (for, e.g., "0" data) is applied to the bit line. At this time, the potential of the bit line is transferred to the drain of the selected memory cell through the selection gate transistor and the non-selected memory cells.

If there is data to be written ("1" data), a high electric field is applied between the gate and drain of the selected memory cell, and electrons are injected from the substrate into the floating gate. As a result, the threshold value of the selected memory cell is shifted in the positive direction. If there is no data to be written ("0" data), the threshold value is not changed.

In a data erase operation, a high potential is applied to a p-type substrate (an n-type substrate and p-type wells if a well structure is employed), and the control gates of all the memory cells and the gates of the selection gate transistors are set at 0 V. With this operation, electrons are discharged from the floating gates of all the memory cells to the substrate, and the threshold value is shifted in the negative direction.

In a data read operation, a selection gate transistor and non-selected memory cells located closer to the bit line than a selected memory cell are turned on, and 0 V is applied to the gate of the selected memory cell. At this time, "0" data or "1" data is discriminated by detecting a current flowing in the bit line.

In such a conventional NAND cell type EEPROM, a data read or write operation is generally performed with respect to all the bit lines at once. For this reason, in a highly integrated EEPROM, capacitive coupling noise between adjacent bit lines poses problems.

For example, in a 4 M-bit NAND cell type EEPROM, a bit line consisting of an Al film has a line width of 1 µm and a line interval of 1.2 µm. As a result, about 50% (0.25 pF) of the capacitance (about 0.5 pF) of one bit line is the capacitance between adjacent bit lines.

Assume that bit lines are precharged to $V_{cc}=5$ V and are subsequently set in a floating state, and data are simultaneously read out to all the bit lines. In this case, if a bit line which is to be kept at 5 V is located between bit lines which are to discharge and change from 5 V to 0 V, the voltage of the bit line which is to be kept at 5 V is decreased to about (½) $V_{cc}= 2.5$ V due to the capacitive coupling. Consequently, no margin is allowed for the voltage of a bit line with respect to a circuit threshold value by which a sense amplifier discriminates "0" data or "1" data, so that this decrease in voltage of a bit line can cause a read operation error.

Similarly, in a data write operation, bit lines connected to memory cells in which no data are written (i.e., "0" data are written) are set at an intermediate potential $V_H$ and are subsequently set in a floating state, while 0 V is applied to bit lines connected to memory cells in which "1" data are written. If, therefore, a non-selected bit line on which no data is to be written is sandwiched between bit lines on which "1" data are to be written, the intermediate potential of the non-selected bit line which is to be kept at the intermediate potential is decreased due to the capacitive coupling. This may cause data write errors in the memory cells connected to the non-selected bit line. Even if write errors are not caused, the threshold value of each memory cell changes, resulting in a deterioration in reliability.

The above-described capacitive coupling noise between bit lines is not limited to NAND cell type EEPROMs but is equally caused in NOR type EEPROMs and in ultraviolet-erasable type EEPROMs. In addition, the problem of noise becomes more serious with an increase in packing density.

As described above, in the conventional EEPROMs, EPROMs, and the like, with an increase in packing density, the capacitive coupling noise between bit lines poses serious problems in terms of characteristics.

SUMMARY OF THE INVENTION

It is an object of the present invention to provide a non-volatile semiconductor memory device in which the influence of capacitive coupling between bit lines is reduced.

According to the present invention, there is provided a non-volatile semiconductor memory device comprising a plurality of bit lines, a plurality of word lines arranged to intersect with the bit lines, a plurality of erasable programmable non-volatile semiconductor memory cells arranged at a plurality of intersecting positions between the bit lines and the word lines and driven by the word lines to exchange data with the bit lines, and precharge means, controlled by a control signal obtained by detecting an address input to each bit line, for fixing a predetermined non-selected bit line at a predetermined potential in advance.

According to the present invention, in a data read operation, for example, non-selected bit lines sandwiching a selected bit line selected by an address are set at a ground potential in advance by the precharge means arranged on each bit line. More specifically, before a word line rises, predetermined non-selected bit lines are changed to 0 V in accordance with an address detection result. With this operation, in a data read operation, when a selected bit line which is to be kept at 5 V is sandwiched between bit lines whose potentials are changed to 0 V, a decrease in potential of the bit line which is to be kept at 5 V can be prevented, thus preventing a read error.

In a data write cycle, all the bit line including non-selected bit lines are precharged to a predetermined potential (an intermediate potential between a power supply potential and a high potential for a write operation). Thereafter, selected bit lines used for data write are discharged in accordance with input data. According to the present invention, in this case, charging circuits for non-selected bit lines each abutted on the selected bit lines selected by an address are kept ON. In this manner, during the data write operation, the charging circuits are kept operated without setting the non-selected bit lines, which are to be kept at the intermediate potential, in a floating state. This prevents a decrease in potential of each non-selected bit line due to capacitive coupling noise caused when adjacent bit lines are changed to 0 V, thereby preventing write errors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiment given below, serve to explain the principles of the invention.

FIG. 1 is a block diagram showing the arrangement of part of a core circuit of an EEPROM according to an embodiment of the present invention;

FIG. 2 is a block diagram showing the arrangement of the remaining part of the core circuit in FIG. 1;

FIG. 4 is a timing chart showing the latter half of the read cycle in the embodiment of FIG. 1;

FIG. 5 is a block diagram showing the arrangement of part of a core circuit of an EEPROM according to another embodiment of the present invention;

FIG. 7 is a timing chart showing the first half of a read cycle of the EEPROM in the embodiment of FIG. 5;

FIG. 10 is a block diagram showing the arrangement of the remaining part of the core circuit in FIG. 9;

FIG. 13 is a block diagram showing the arrangement of part of a core circuit of an EEPROM according to still another embodiment of the present invention;

FIG. 14 is a circuit diagram showing the arrangement of a cell array portion of the core circuit in FIG. 13;

FIG. 15 is a block diagram showing the arrangement of the remaining part of the core circuit in FIG. 13;

FIG. 17 is a timing chart showing the first half of the read cycle in the embodiment of FIG. 13;

FIG. 18 is a timing chart showing the latter half of the read cycle of the EEPROM in the embodiment of FIG. 13;

FIG. 19 is a timing chart showing the latter half of the read cycle in the embodiment of FIG. 13;

FIG. 21 is a timing chart showing the first half of the write cycle in the embodiment of FIG. 13;

FIG. 22 is a timing chart showing the latter half of the write cycle of the EEPROM in the embodiment of FIG. 13; and FIG. 23 is a timing chart showing the latter half of the write cycle in the embodiment of FIG. 13.

DETAILED DESCRIPTION OF THE PREFERRED EMBODIMENTS

Figure 3:
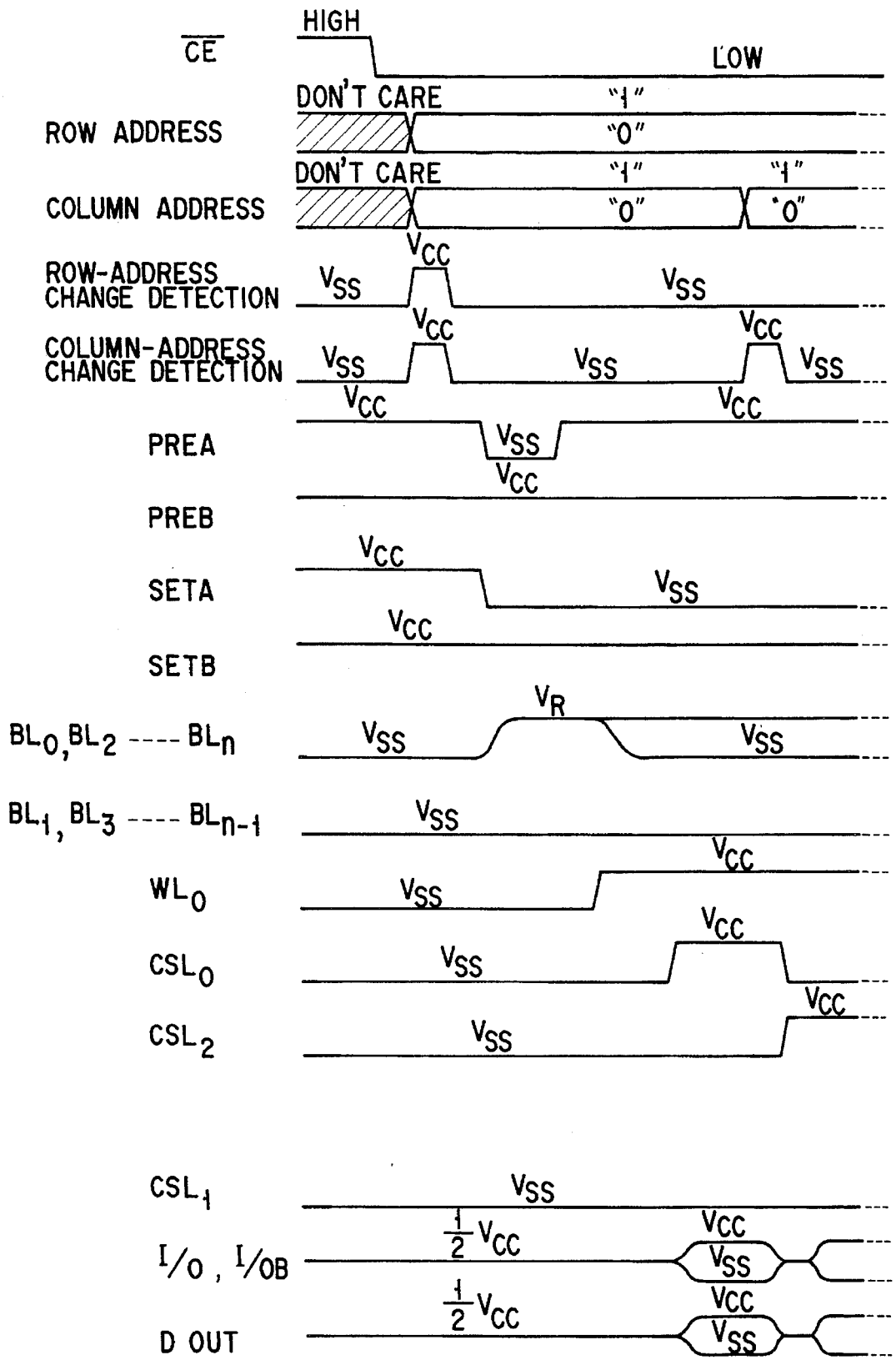
FIG. 3 is a timing chart showing the first half of a read cycle of the EEPROM in the embodiment of FIG. 1.

In a core circuit section of an EEPROM according to an embodiment of the present invention shown in FIGS. 1 and 2, a plurality of bit lines BL ($BL_0$, $BL_1$, . . . , $BL_n$) and a plurality of word lines WL ($WL_0$, $WL_1$, . . . , $WL_m$) are arranged to intersect with one another, and memory cells $MC_{ij}$ (i=0, 1, . . . , m; j=0, 1, . . . , n) are arranged at the respective intersecting portions, thus constituting a memory cell array. Each memory cell $MC_{ij}$ is constituted by an electrically erasable programmable non-volatile semiconductor memory cell of an FETMOS type having a floating gate and a control gate which are insulatively stacked over a semiconductor substrate. The control gate and drain of each memory cell are respectively connected to the word line WL and the bit line BL.

A flip-flop type sense amplifier S/A (S/A0, S/A1, . . . , S/An) for reading/writing data is connected to one end of each of the bit lines BL. The node of the sense amplifier S/A is connected to data input/output lines I/O and I/OB through a transfer gate controlled by a column selection signal CSL ($CSL_0$, $CSL_1$, . . . , $CSL_n$). The data input/output line I/O and I/OB are respectively connected to external data input and output terminals through a data input buffer and a data output buffer.

Read charging transistors $Q_{02}$, $Q_{22}$, . . . , $Q_{12}$, $Q_{32}$, . . . , constituted by PMOS transistors, and read discharging transistors $Q_{01}, Q_{21}, \ldots, Q_{11}, Q_{31}, \ldots$, constituted by NMOS transistors, are respectively connected to the bit lines BL. These transistors serve as means for precharging the bit lines BL to predetermined potentials so as to perform data read operations.

The read charging transistors $Q_{02}, Q_{22}, \ldots, Q_{12}, Q_{32}, \ldots$ are transistors for precharging the bit lines BL to a read potential $V_R$ (e.g., an external power supply potential). The transistors $Q_{12}, Q_{32}, \ldots$ connected to the even bit lines $BL_1$, $BL_3, \ldots$ are simultaneously controlled by a control signal PREA. The transistors $Q_{02}, Q_{22}, \ldots$ connected to the odd bit lines $BL_0, BL_2, \ldots$ are simultaneously controlled by another control signal PREB. The control signals PREA and PREB are obtained by detecting a change of input address. These control signals serve to control the potential of the bit lines BL depending on whether an address designates the odd or even bit lines BL.

The read discharging transistors $Q_{01}, Q_{21}, \ldots, Q_{11}, Q_{31}, \ldots$ are transistors for setting non-selected bit lines at the ground potential in advance. The transistors $Q_{11}, Q_{31}, \ldots$ connected to the even bit lines $BL_1, BL_3, \ldots$ are simultaneously controlled by a control signal SETA. The transistors $Q_{01}, Q_{21}, \ldots$ connected to the odd bit lines $BL_0, BL_2, \ldots$ are simultaneously controlled by another control signal SETB. These control signals SETA and SETB also serve as signals for controlling the potentials of the bit lines BL depending on whether an address designates the odd or even bit lines BL.

Although a bit line potential control circuit section for performing data write operations is not shown in FIGS. 1 and 2, a description thereof will be given later.

A data read operation of the EEPROM having the above-described arrangement will be described below.

FIGS. 3 and 4 are timing charts respectively showing the first and latter halves of a read cycle. More specifically, FIG. 3 shows a state wherein the odd bit lines are selected; and FIG. 4, a state wherein the even bit lines are selected.

In an initial state, since both the control signals PREA and PREB are set at Vcc, i.e., "H" level, all the read charging transistors $Q_{02}, Q_{22}, \ldots, Q_{12}, Q_{32}, \ldots$ are OFF. In addition, since both the control signals SETA and SETB are set at Vcc, all the read discharging transistors $Q_{01}, Q_{21}, \ldots, Q_{11}, Q_{31}, \ldots$ are ON. Therefore, all the bit lines BL are set at the source power supply potential Vss (normal ground potential).

A chip enable signal changes from "H" level to "L" level, and a row address and column address are externally input to the chip. Inside the chip, address change detectors are operated to generate a row address change detection pulse and a column address change detection pulse.

When the address change detectors are operated in this manner, and the odd bit lines are selected by the input row address, the signal SETA of the control signals SETA and SETB changes from Vcc to Vss to turn off the read discharging transistors $Q_{01}, Q_{21}, \ldots$ connected to the odd bit lines $BL_0, BL_2, \ldots$ At the same time, the signal PREA of the control signals PREA and PREB is set at Vss to turn on the read charging transistors $Q_{12}, Q_{32}, \ldots$ connected to the odd bit lines $BL_0, BL_2, \ldots$, thereby precharging the odd bit lines $BL_0, BL_2, \ldots$ to the read potential $V_R$. The even bit lines $BL_1, BL_3, \ldots$ are kept at Vss because the discharging transistors $Q_{11}, Q_{31}, \ldots$ are kept ON.

When the word line $WL_0$ selected by the row address changes from Vss to Vcc after the odd bit lines $BL_0, BL_2$, ... are precharged to the read potential $V_R$, data are read out only from the memory cells $MC_{00}, MC_{02}, \ldots, MC_{0n-1}$ arranged along the word line WL0 connected to the odd bit lines $BL_0, BL_2, \ldots$ No data are read out from the memory cells $MC_{01}, MC_{03}, \ldots, MC_{0n}$ connected to the even non-selected bit lines $BL_1, BL_3, \ldots$ driven by the same word line WL0, since the non-selected bit lines $BL_1, BL_3, \ldots$ are fixed to Vss in advance. Such an operation is possible because each memory cell is constituted by a non-volatile semiconductor memory of a nondestructive read type, unlike a DRAM or the like.

The data read out to the odd bit lines $BL_0, BL_2, \ldots$ are respectively detected by the sense amplifiers S/A0, S/A2, . . . When one column selection signal $CSL_0$ selected by the column address is set at "H" level, the data latched by the sense amplifier S/A0 is output from the output buffer through the input/output lines I/O and I/OB. When the column address changes, the column address change detector detects this change to set the next column selection line $CSL_2$ at "H" level. As a result, the data latched by the sense amplifier S/A2 is output. Subsequently, continuous column reading associated with the odd bit lines is performed in the same manner as described above. The data read operation to this point is shown in FIG. 3.

When the row address changes, the row address change detector detects this change to generate an address change detection pulse. Thereafter, a data read operation is started again from the selection of the even or odd bit lines. FIG. 4 shows a case wherein the even bit lines are selected. In this case, contrary to the above description, the odd bit lines $BL_0$, $BL_2, \ldots$ are fixed to Vss, and data are read out from the memory cells connected to the even bit lines $BL_1, BL_3, \ldots$ FIG. 4 shows a case wherein the word line $WL_0$ is selected. In this case, the data of the memory cells $MC_{01}, MC_{03}, \ldots$ are read out to the even bit lines $BL_1, BL_2, \ldots$ When the column selection signal $SCL_1$ is set at "H" level, the data of the sense amplifier S/A1 is output. Subsequently, when the row address changes, and the column selection signal $CSL_3$ is set at "H" level, the data of the sense amplifier S/A3 is output. Subsequently, continuous column reading associated with the even bit lines is performed in the same manner as described above.

As described above, in this embodiment, when the even bit lines are selected in accordance with an address, the odd non-selected bit lines are set at Vss before a word line is selectively driven. Similarly, when the odd bit lines are selected, the even bit lines are set at Vss in advance as non-selected bit lines. Therefore, unlike the conventional memory device, in a data read operation, since the non-selected bit lines do not change from the precharge potential Vcc to 0 V, the precharge potential of the selected bit lines between the non-selected bit lines is not decreased by capacitive coupling. This reliably prevents operation errors.

Figure 6:
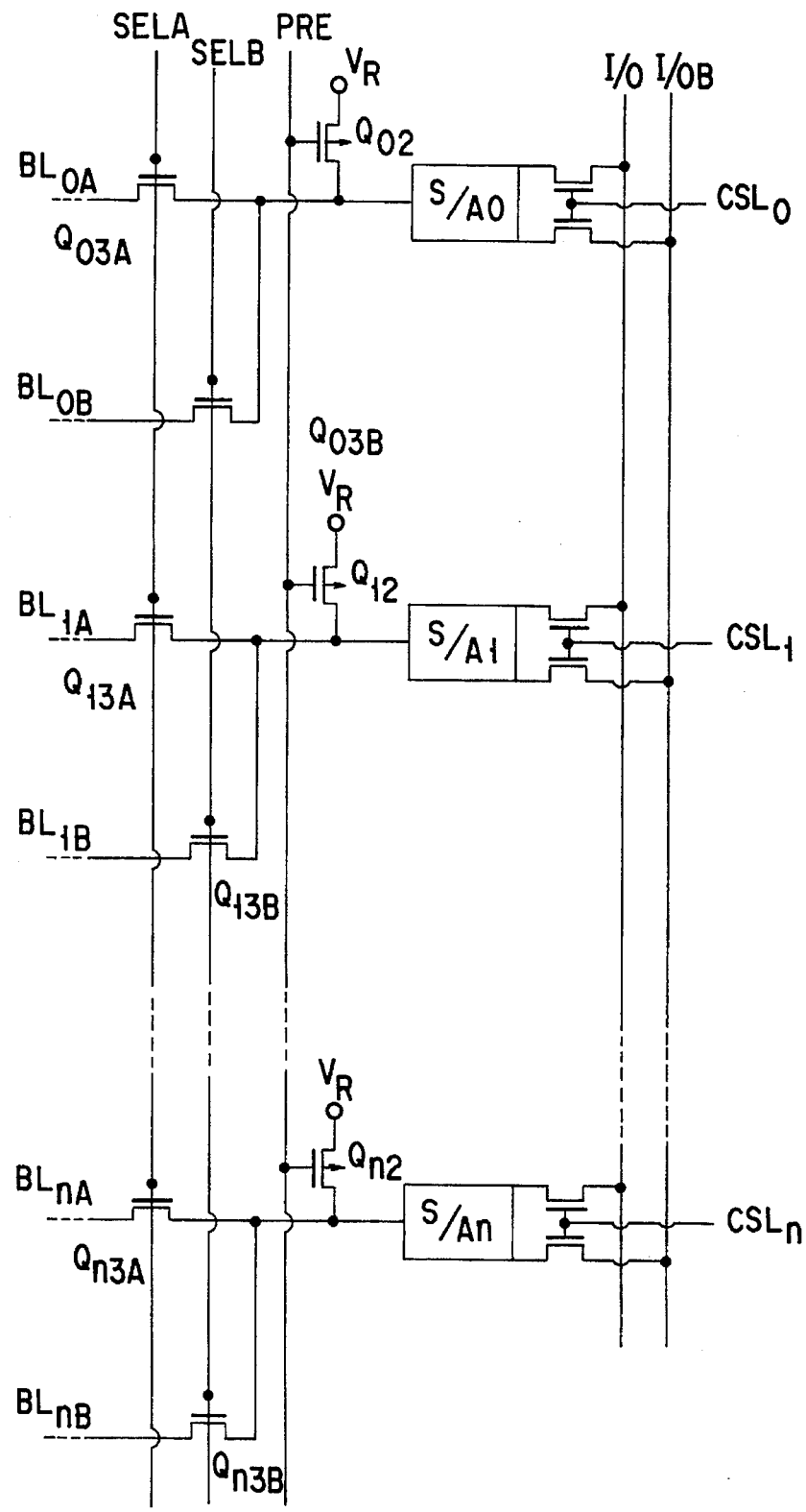
FIG. 6 is a block diagram showing the arrangement of the remaining part of the core circuit in FIG. 5.

FIGS. 5 and 6 show the arrangement of a core circuit section of an EEPROM according to another embodiment of the present invention. In this embodiment, odd bit lines $BL_{0A}, BL_{1A}, \ldots, BL_{nA}$ and even bit lines $BL_{0B}, BL_{1B}, \ldots, BL_{nB}$ are respectively paired to share sense amplifiers S/A0, S/A1, ..., S/An. The arrangements of memory cells $MC_{ijA}$ and $MC_{ijB}$ and a cell array are the same as those in the previous embodiment. Similar to the previous embodiment, read discharging transistors $Q_{01A}, Q_{11A}, \ldots, Q_{n1A}$ and $Q_{01B}$, $Q_{11B}, \ldots, Q_{n1B}$, which are respectively controlled by different control signals SETA and SETB depending on whether the odd or even bit lines are selected, are respectively connected to the bit lines.

The sense amplifier side ends of the respective bit lines BL are connected, in pairs, to the sense amplifiers S/A0, S/A1, . . . , S/An through selection gate transistors $Q_{03A}$, $Q_{13A}, \ldots, Q_{n3A}$ and $Q_{03B}, Q_{n3B}, \ldots, Q_{n3B}$ for selecting the even or odd bit lines. The selection gate transistors $Q_{03A}$, $Q_{13A}, \ldots, Q_{n3A}$ and $Q_{03B}, Q_{13B}, \ldots, Q_{n3B}$ are respectively controlled by different control signals SELA and SELB determined by addresses. Read charging transistors $Q_{02}$, $Q_{12}, \ldots, Q_{n2}$ constituted by PMOS transistors are respectively arranged at the positions where the bit lines are paired.

Figure 8:
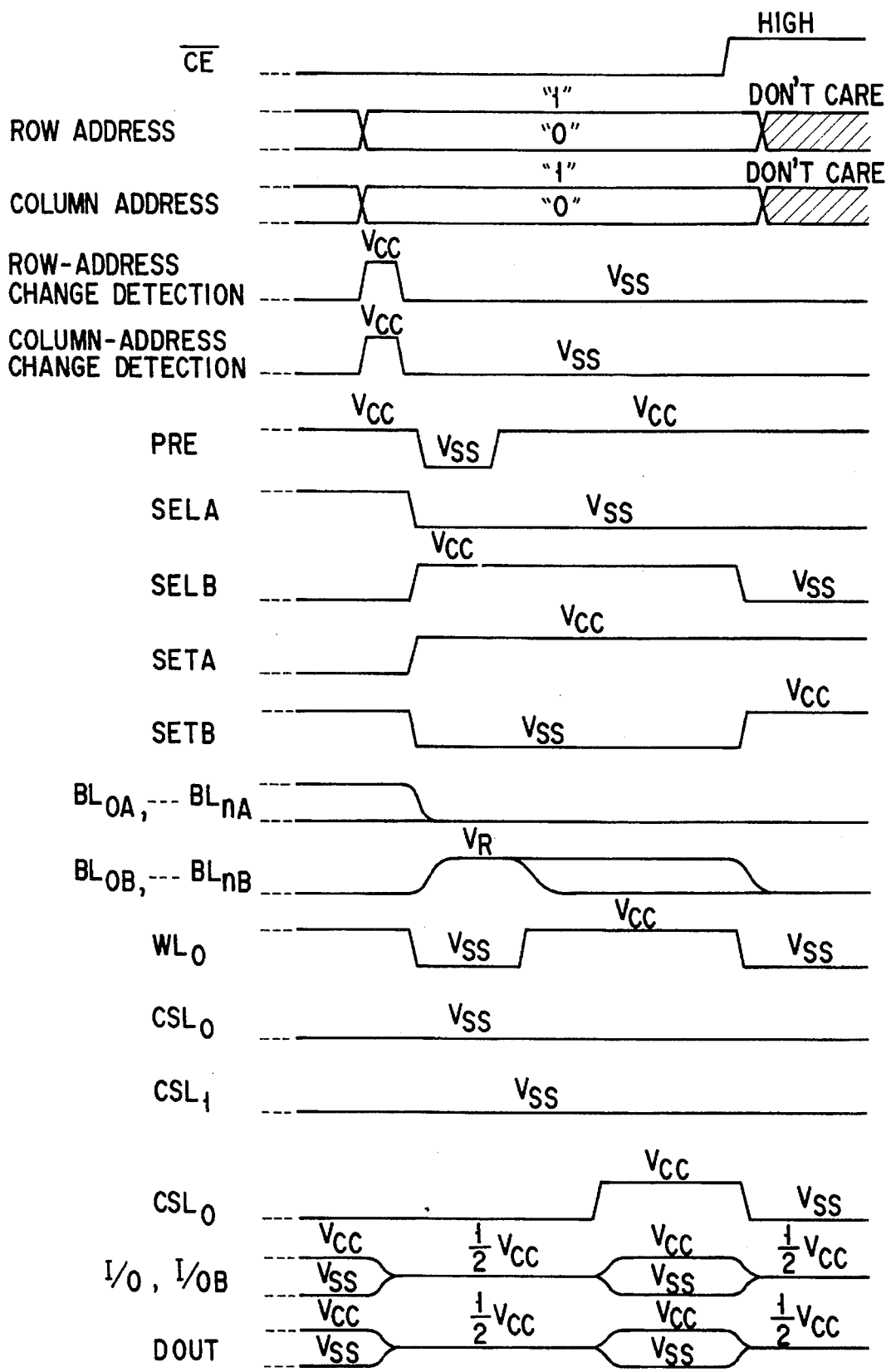
FIG. 8 is a timing chart showing the latter half of the read cycle in the embodiment of FIG. 5.

FIGS. 7 and 8 are timing charts showing a read cycle of the EEPROM of this embodiment.

In an initial state, a transistor control signal PRE for the charging transistors is at "H" level, the control signals SELA and SELB for the selection gates are at "L" level, and the control signals SETA and SETB for the discharging transistors are at "H" level, so that all the bit lines BL are set at the source power supply potential Vss (normal ground potential), similar to the previous embodiment.

A chip enable signal changes from "H" level to "L" level, and a row address and a column address are externally input to the chip. Inside the chip, address change detectors are operated to generate a row address change detection pulse and a column address change detection pulse.

When the address change detectors are operated in this manner, and the odd bit lines are selected by the input row address, the signal SETA of the control signals SETA and SETB changes from Vcc to Vss. As a result, the read discharging transistors $Q_{01}, Q_{21}, \ldots$ connected to the odd bit lines $BL_{0A}, BL_{1A}, \ldots, BL_{nA}$ are turned off. At the same time, the control signal PRE is set at Vss, and the signal SELB of the selection gate control signals SELA and SELB is set at "H" level. As a result, the selection gate transistors $Q_{03A}$, $Q_{13A}, \ldots$ connected to the odd bit lines $BL_{0A}, BL_{1A}, \ldots$ are turned on, thereby precharging the odd bit lines $BL_{0A}, BL_{1A}$, ... to a read potential $V_R$. The even bit lines $BL_{0B}, BL_{1B}$, . . . are kept at Vss.

When the word line WL0 selected by the row address changes from Vss to Vcc after the odd bit lines $BL_{0A}, BL_{1A}$, . . . are precharged to the read potential $V_R$, data are read out from memory cells $MC_{00A}, MC_{01A}, \ldots, MC_{0nA}$ arranged along the word line WL0 connected to the odd bit lines $BL_{0A}, BL_{1A}, \ldots$ No data are read out from memory cells $MC_{00B}, MC_{01B}, \ldots, MC_{0nB}$ connected to the non-selected bit lines $BL_{0B}, BL_{1B}, \ldots$ driven by the same word line $WL_0$.

The data read out to the odd bit lines $BL_{0A}, BL_{1A}, \ldots$ are respectively detected by the sense amplifiers S/A0, S/A1, ... When a column selection signal $CSL_0$ is set at "H" level, the data latched by the sense amplifier S/A0 is output from an output buffer through input/output lines I/O and I/OB. When the column address changes, and the column address change detector detects this change to set a next column selection line $CSL_1$ at "H" level, the data latched by the sense amplifier S/A1 is output. Subsequently, continuous column reading associated with the odd bit lines is performed in the same manner as described with reference to the previous embodiment.

Furthermore, when the row address changes, the row address change detector detects this change to generate a pulse. Thereafter, a data read operation is started again from the selection of the even or odd bit lines. FIG. 8 shows a case wherein the even bit lines are selected. In this case, contrary to the above description, the odd bit lines $BL_{0A}, BL_{1A}, \ldots$ are fixed to Vss, and data are read from the memory cells connected to the even bit lines $BL_{0B}, BL_{1B}, \ldots$ Similar to the above-described case, if the word line $WL_0$ is selected, the data of the memory cells $MC_{00B}, MC_{01B}, \ldots$ are read out to the even bit lines $BL_{0B}, BL_{1B}, \ldots$ When the column selection signal $CSL_0$ is set at "H" level, the data of the sense amplifier S/A0 is output. Subsequently, continuous column reading associated with the even bit lines can be performed in the same manner as described above.

In the embodiment shown in FIGS. 5 and 6, two bit lines share one sense amplifier, and non-selected bit lines are fixed to Vss when the even or odd bit lines are selected. However, the present invention can be applied to a case wherein a proper number of bit lines other than two bit lines, e.g., four or eight bit lines, share one sense amplifier, and a read operation is performed by selecting one of these bit lines.

Figure 9:
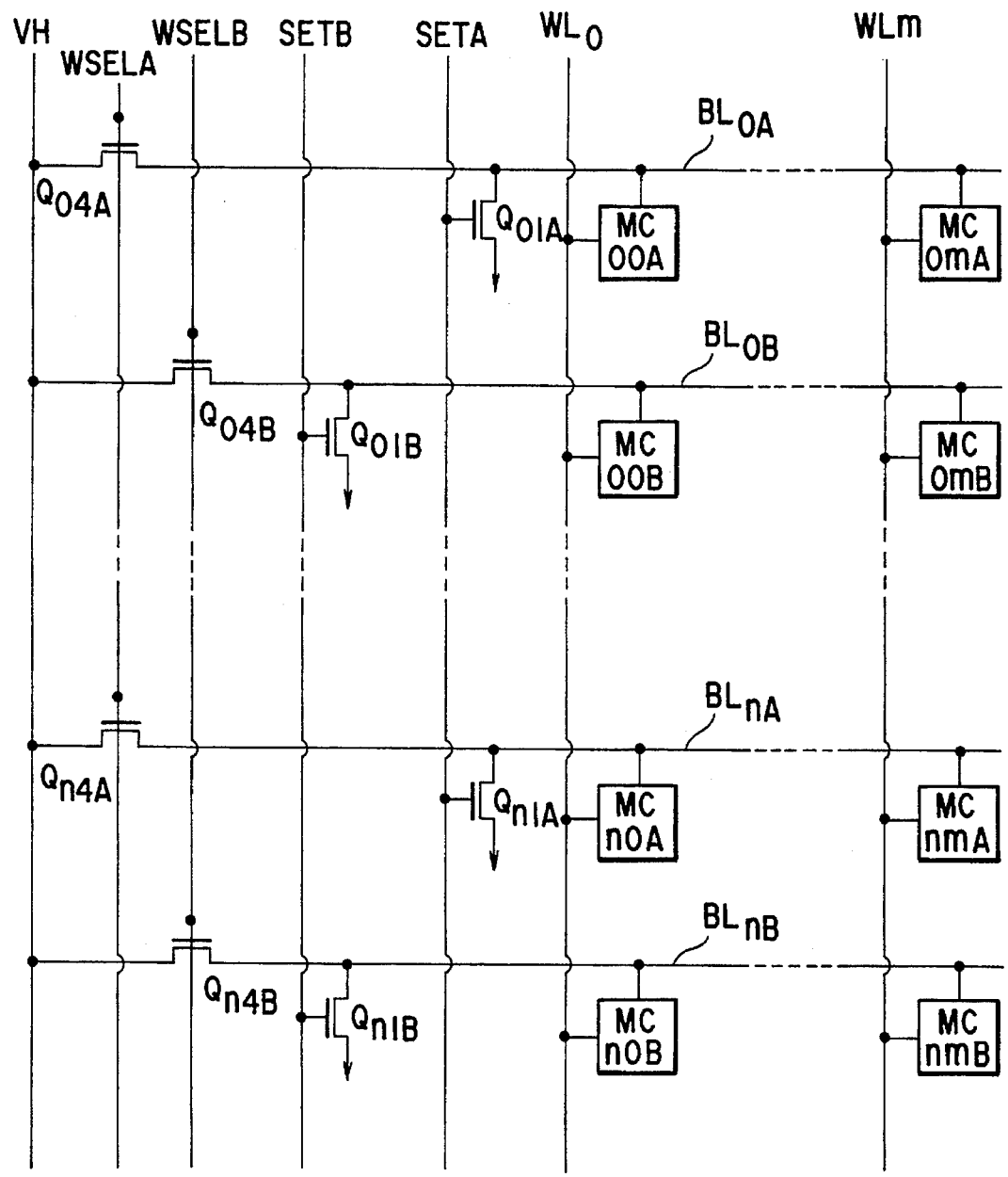
FIG. 9 is a block diagram showing the arrangement of part of a core circuit of an embodiment in which a data write control circuit section is added to the EEPROM shown in FIGS. 5 and 6.

FIGS. 9 and 10 show an embodiment in which circuits required to write data are added to the EEPROM of the embodiment shown in FIGS. 5 and 6. In addition to the arrangement of the embodiment shown in FIGS. 5 an 6, this embodiment includes write charging transistors $Q_{04A}, \ldots$, $Q_{n4A}$ and $Q_{04B}, \ldots, Q_{n4B}$ constituted by NMOS transistors and respectively connected to bit lines BL. These write charging transistors $Q_{04A}, \ldots, Q_{n4A}$ and $Q_{04B}, \ldots, Q_{n4B}$ are arranged to apply a potential $V_H$ (preferably an intermediate voltage between a power supply potential Vcc and a high potential Vpp applied to word lines WL during a write operation), which is higher than the power supply potential Vcc, to the bit lines BL. Of these transistors, the transistors $Q_{04A}, \ldots Q_{n4A}$ connected to the odd bit lines are simultaneously controlled by a control signal WSELA, and the transistors $Q_{04B}, \ldots, Q_{n4B}$ connected to the even bit lines are controlled by another control signal WSELB.

The write control signals WSELA and WSELB serve to control the write charging transistors $Q_{04A}, \ldots, Q_{n4A}$ and $Q_{04B}, \ldots, Q_{n4B}$ so as to precharge all the bit lines to the intermediate potential $V_H$ before write data are supplied from sense amplifiers to the bit lines, and set selected bit lines (e.g., the odd bit lines) in a floating state while continuously applying the intermediate potential $V_H$ to non-selected bit lines (e.g., even bit lines) in a data write operation.

Figure 11:
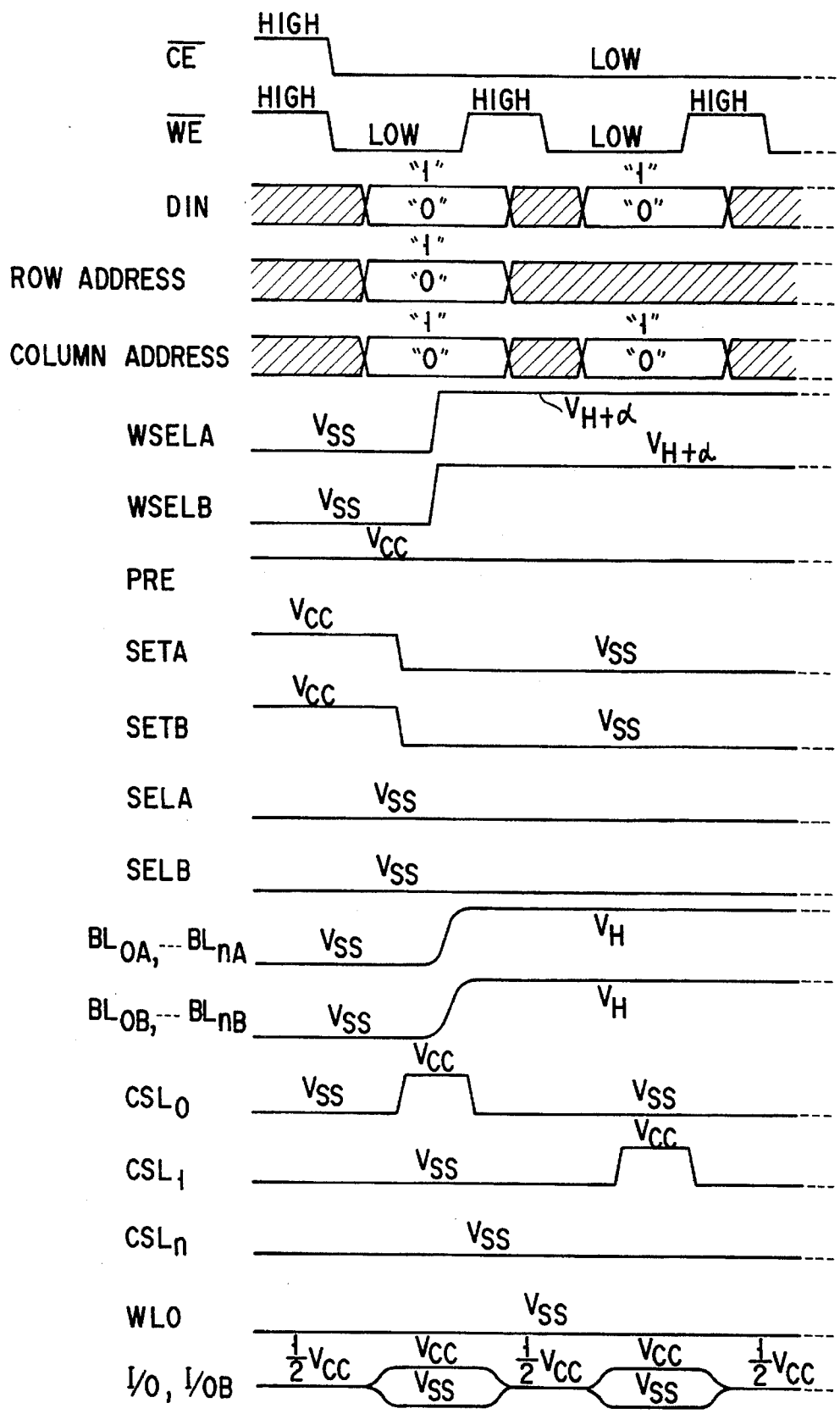
FIG. 11 is a timing chart showing the first half of a write cycle in the embodiment of FIG. 9.
Figure 12:
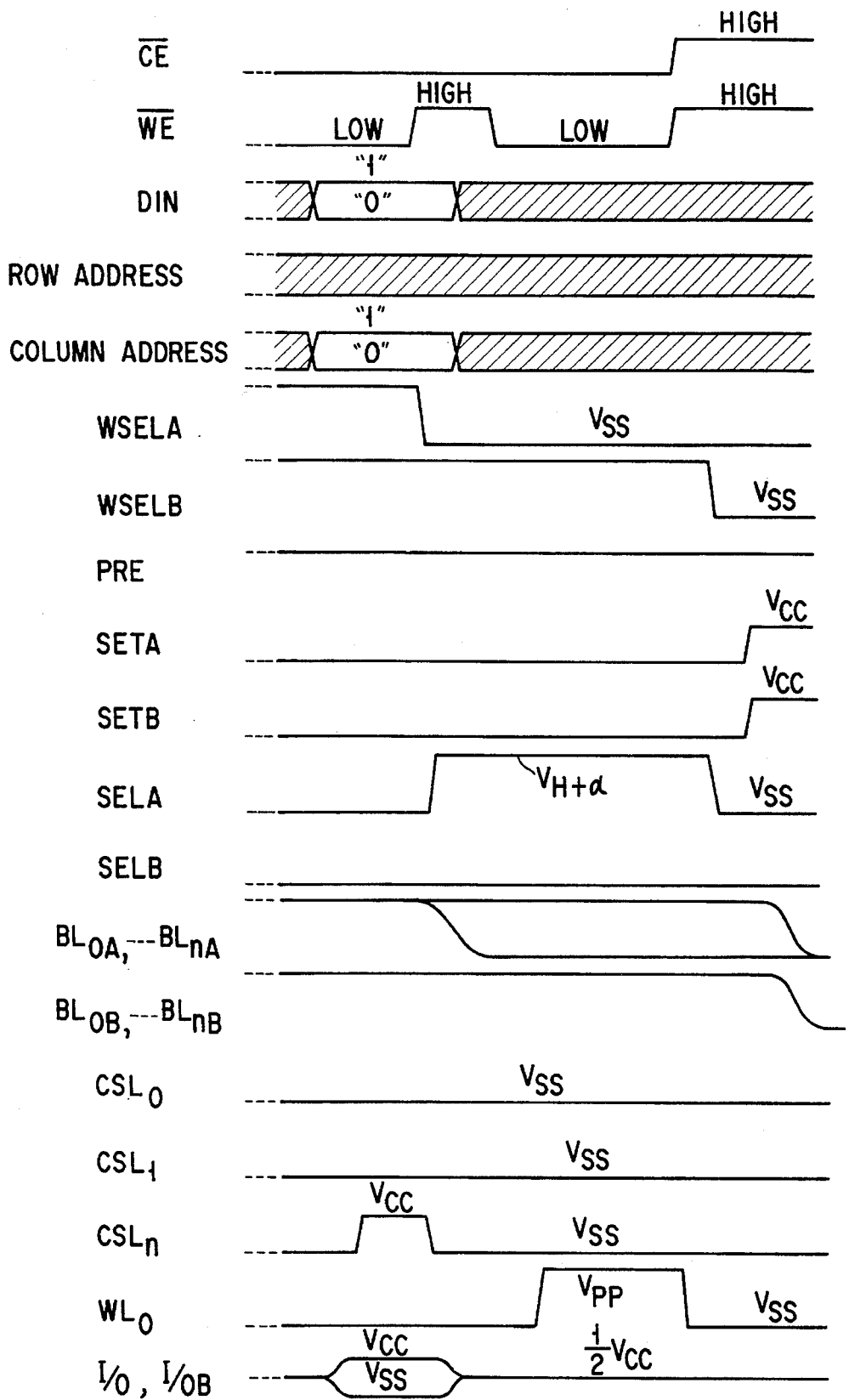
FIG. 12 is a timing chart showing the latter half of the write cycle in the embodiment of FIG. 9.

FIGS. 11 and 12 are timing charts respectively showing the first and latter halves of a data write cycle of the EEPROM of this embodiment. A write operation will be described in detail below with reference to FIGS. 11 and 12.

When a chip enable signal and a write enable signal change from "H" level to "L" level, a write operation is started. In the first step, data supplied from input and output buffers are written in sense amplifiers S/A0, S/A1, ... S/An through input/output lines I/O and I/OB. More specifically, as shown in FIG. 11, when column selection signals $CSL_0$, $CSL_1$, . . . are sequentially set at "H" level in accordance with a column address, serial data are sequentially written in the sense amplifiers synchronously with these signal changes. If (n+1) sense amplifiers are arranged, the above-described operation is repeated until data is written in the nth sense amplifier.

While this data write operation is performed with respect to the sense amplifiers, both the write control signals WSELA and WSELB change from Vss to VH+' (' is a voltage equivalent to the threshold voltage of the write charging transistors $Q_{04A}, \ldots, Q_{n4A}$ and $Q_{04B}, \ldots, Q_{n4B}$), and all the bit lines BL are precharged to the intermediate potential $V_H$.

After the data is written in the nth sense amplifier S/An, one of the write control signals WSELA and WSELB is set at Vss in accordance with a row address. FIG. 12 shows a case wherein data are written on the odd bit lines $BL_{0A}, \ldots, BL_{nA}$. In this case, the control signal WSELA is set at Vss. As a result, the write charging transistors $Q_{04A}, \ldots, Q_{n4A}$ connected to the odd bit lines $BL_{0A}, \ldots, BL_{nA}$ are turned off. With this operation, in accordance with the data transferred beforehand to the sense amplifiers S/A0, ..., S/An, the odd bit lines $BL_{0A}, \ldots, BL_{nA}$ are set at Vss (in a "1" data write operation) or $V_H$ (in a "0" data write operation).

Subsequently, when the selected word line $WL_0$ changes from Vss to the write potential Vpp, electrons are injected to the floating gates of the memory cells connected to bit lines, of the odd bit lines $BL_{0A}, \ldots, BL_{nA}$, which are at Vss, thereby completing a "1" data write operation. During this period, since the charging transistors $Q_{04B}, \ldots, Q_{n4B}$ are kept ON, all the even bit lines $BL_{0B}, \ldots, BL_{nB}$ are not set in a floating state but are fixed to the intermediate potential $V_H$.

When a data write operation is to be performed with respect to the even bit lines $BL_{0B}, \ldots, BL_{nB}$, contrary to the above-described operation, all the non-selected odd bit lines $BL_{0A}, \ldots, BL_{nA}$ are fixed to the intermediate potential $V_H$ during the write operation.

In this embodiment, alternate non-selected bit lines are fixed to the intermediate potential $V_H$ during a write operation in this manner. Therefore, unlike the conventional memory device, since non-selected bit lines precharged to the intermediate potential $V_H$ are not changed to a floating state, the potential of each non-selected bit line between selected bit lines, which change to Vss to perform a "1" data write operation, is not decreased.

An embodiment in which the present invention is applied to a NAND cell type EEPROM will be descried next.

FIGS. 13 to 15 show a core circuit section of the NAND cell type EEPROM of this embodiment. FIG. 13 shows the arrangement of bit line end portions opposite to the sense amplifier side bit line ends of the circuit. FIG. 14 shows the arrangement of a cell array. FIG. 15 shows the arrangement of the sense amplifier side bit line ends.

As shown in FIG. 14, each NAND cell is constituted by, e.g., a plurality of (eight in FIG. 14) FETMOS type memory cells connected in series such that adjacent memory cells respectively share sources and drains. The drain terminals of the NAND cells are connected to bit lines BL through selection gates controlled by selection gate lines $SG_{D0}$, $SG_{D1}$, ... The source terminals of the NAND cells are connected to common source lines through selection gates controlled by selection gate lines $SG_{S0}$, $SG_{S1}$, ... The control gates of the memory cells aligned in a direction to cross the bit lines BL are commonly connected to each other to constitute word lines WL.

Similar to the previous embodiment, read discharging transistors $Q_{01A}, \ldots, Q_{n1A}, Q_{01B}, \ldots, Q_{n1B}$, and write charging transistors $Q_{04A}, \ldots, Q_{n4A}, Q_{04B}, \ldots, Q_{n4B}$ are arranged on the bit line ends opposite to the sense amplifier side bit line ends of the cell array, as shown in FIG. 13.

Similar to the previous embodiment, the sense amplifier side bit line ends of the cell array are paired through selection gate transistors $Q_{03A}, \ldots, Q_{n3A}, Q_{03B}, \ldots, Q_{n3B}$, and read charging transistors $Q_{02}, \ldots, Q_{n2}$ are respectively connected to the paired bit line ends, as shown in FIG. 15.

Each of sense amplifiers S/A0, ..., S/An is constituted by a flip-flop consisting of a combination of two clocked CMOS inverters.

Figure 16:
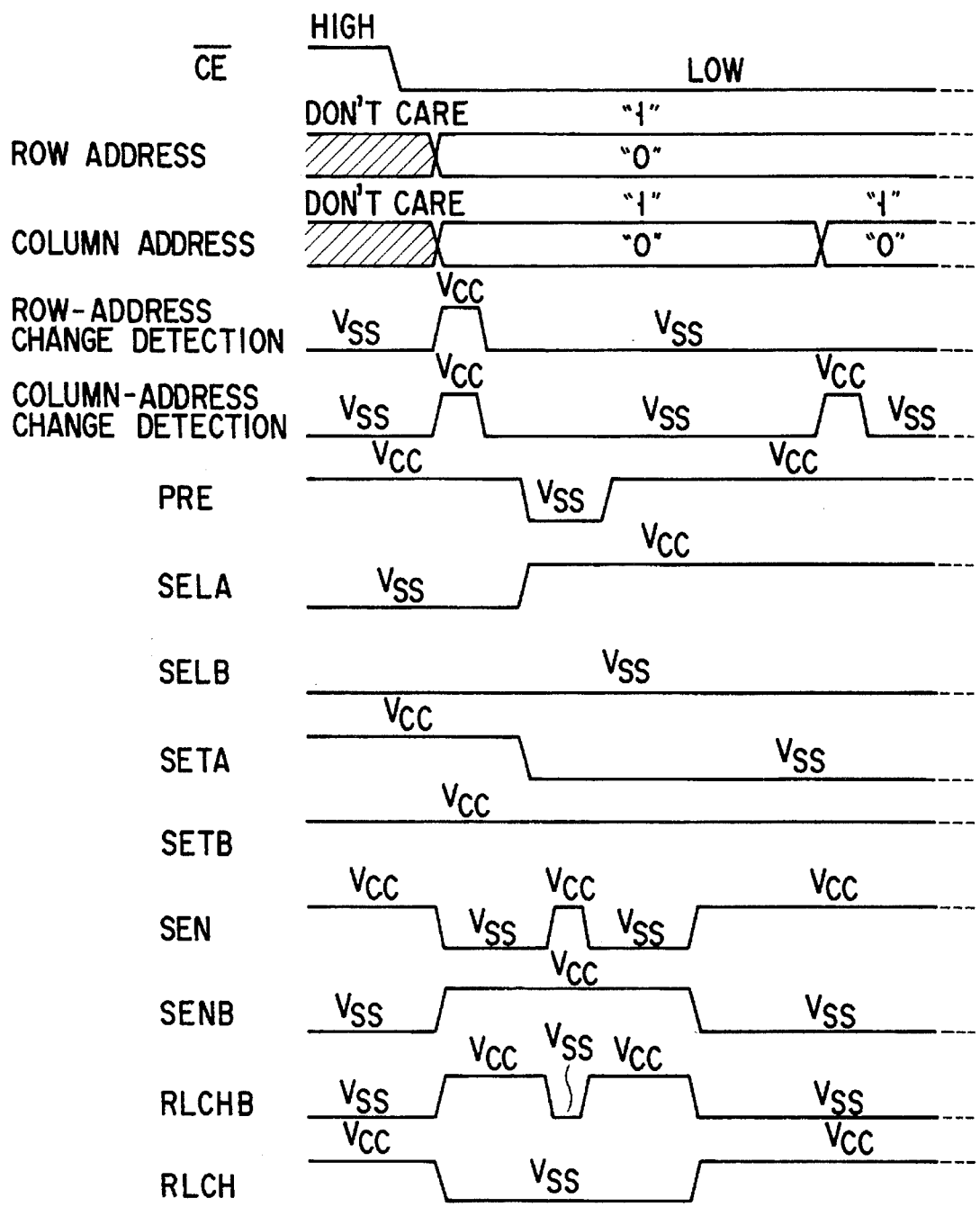
FIG. 16 is a timing chart showing the first half of a read cycle of an EEPROM in the embodiment of FIG. 13.

FIGS. 16 to 19 are timing charts showing a read cycle of the NAND cell type EEPROM of this embodiment. FIGS. 16 and 17 show the first half of the read cycle. FIGS. 18 and 19 show the latter half of the read cycle. In order to facilitate understanding of the timing of the read cycle, each of FIGS. 16 to 19 shows the waveforms of a chip enable signal and row and column address signals. A read operation will be described below with reference to these timing charts.

When the chip enable signal changes from "H" level to "L" level, and row and column addresses are externally input to the chip, address change detectors are operated inside the chip to respectively generate a row address change detection pulse and a column address change detection pulse, as shown in FIG. 16.

When data are to be read out from the memory cells connected to odd bit lines $BL_{0A}, \ldots, BL_{nA}$ by the row address, even bit lines $BL_{0B}, \ldots, BL_{nB}$ are kept at a ground potential Vss during a read operation. More specifically, of control signals SETA and SETB, the signal SETA changes from Vcc to Vss in response to the row address, thus turning off the read discharging transistors $Q_{01A}, \ldots, Q_{n1A}$ connected to the odd bit lines $BL_{0A}, \ldots, BL_{nA}$. At the same time, a control signal PRE is set at Vss. As a result, of control signals SELA and SELB for bit line selection gates, the signal SELA is set at "H" level, thus turning on the selection gate transistors $Q_{03A}, \ldots, Q_{n3A}$ connected to the odd bit lines $BL_{0A}, \ldots, BL_{nA}$. With this operation, the odd bit lines $BL_{0A}, \ldots, BL_{nA}$ are precharged to a read potential $V_R$. The even bit lines $BL_{0B}, \ldots, BL_{nB}$ are kept at Vss.

The sense amplifiers S/A0, ..., S/An are set in an inactive state before the data of the memory cells are read out to the bit lines. This operation is performed by changing sense amplifier control signals SEN and RLCH from Vcc to Vss and changing control signals SENB and RLCHB from Vss to Vcc. Note that after the odd bit lines $BL_{0A}, \ldots, BL_{nA}$ are precharged to the read potential $V_R$, in order to initialize the sense amplifiers, the control signal SEN may be changed from Vss to Vcc and restored to Vss, while the control signal RLCHB is synchronously changed from Vcc to Vss and restored to Vcc.

Subsequently, non-selected word lines determined by the row address, i.e., word lines $WL_{01}$ to $WL_{07}$ in FIG. 17 and selection gate lines $SG_{S0}$ and $SG_{D0}$, change from Vss to Vcc, and a selected word line $WL_{00}$ is kept at Vss. For example, the threshold voltage of each memory cell is set to fall within the range between 0.5 V and 3.5 V in a "1" data read operation, and is set to be −0.1 V or less in a "0" data read operation. With this setting, data are read out from memory cells $MC_{00A}, \ldots, MC_{0nA}$, of memory cells $MC_{00A}, MC_{00B}, \ldots, MC_{0nA}, MC_{0nB}$ arranged along the selected word line $WL_{00}$, which are connected to the odd bit lines $BL_{0A}, \ldots, BL_{nA}$, by setting the selected word line $WL_{00}$ at Vss=0 V and setting the non-selected word lines $WL_{01}$ to $WL_{07}$ and the selection gate lines $SG_{S0}$ and $SG_{D0}$ at Vcc=5 V. Since the even non-selected bit lines $BL_{0B}, \ldots, BL_{nB}$ are fixed to Vss, no data are read out from the memory cells $MC_{00B}, \ldots, MC_{0nB}$ arranged at the intersecting portions on the selected word line $WL_{00}$.

When the sense amplifiers S/A0, ..., S/An are activated, i.e., the control signals SEN and RLCH are set at Vcc and the signals SENB and RLCHB are set at Vss, the data read out to the odd bit lines $BL_{0A}, \ldots, BL_{nA}$ in this manner are respectively latched by the sense amplifiers S/A0 ..., S/An.

When a column selection signal $CSL_0$ is set at "H" level, the data latched by the sense amplifier S/A0 is output from an output buffer through input/output lines I/O and I/OB.

When the column address changes, and the column address change detector detects this change to set a next column selection line $CSL_1$ at "H" level, the data latched by the sense amplifier S/A1 is output. Subsequently, continuous column reading associated with the odd bit lines is performed in the same manner as described with reference to the previous embodiment.

Furthermore, when the row address changes, the row address change detector detects this change to generate a pulse. A read operation is then started again from the selection of the even or odd bit lines. FIGS. 18 and 19 show a case wherein the even bit lines are selected. In this case, contrary to the above description, the odd bit lines $BL_{0A}$, ..., $BL_{nA}$, ... are fixed to Vss, and data are read out from the memory cells connected to the even bit lines $BL_{0B}$, ..., $BL_{nB}$. Similar to the above-described operation, if the word line $WL_{00}$ is selected, the data of the memory cells $MC_{00B}$, ..., $BC_{0nB}$ are read out to the bit lines $BL_{0B}$, ..., $BL_{nB}$. When the column selection signal $CSL_0$ is set at "H" level, the data of the sense amplifier S/A0 is output. Subsequently, continuous column reading associated with the even bit lines can be performed in the same manner as described above.

During the above-described read operation, "H"- and "L"-level potentials BITH and BITL of each sense amplifier may be respectively set to be Vcc and Vss.

A data write operation of this embodiment will be described below with reference to FIGS. 20 to 23.

Figure 20:
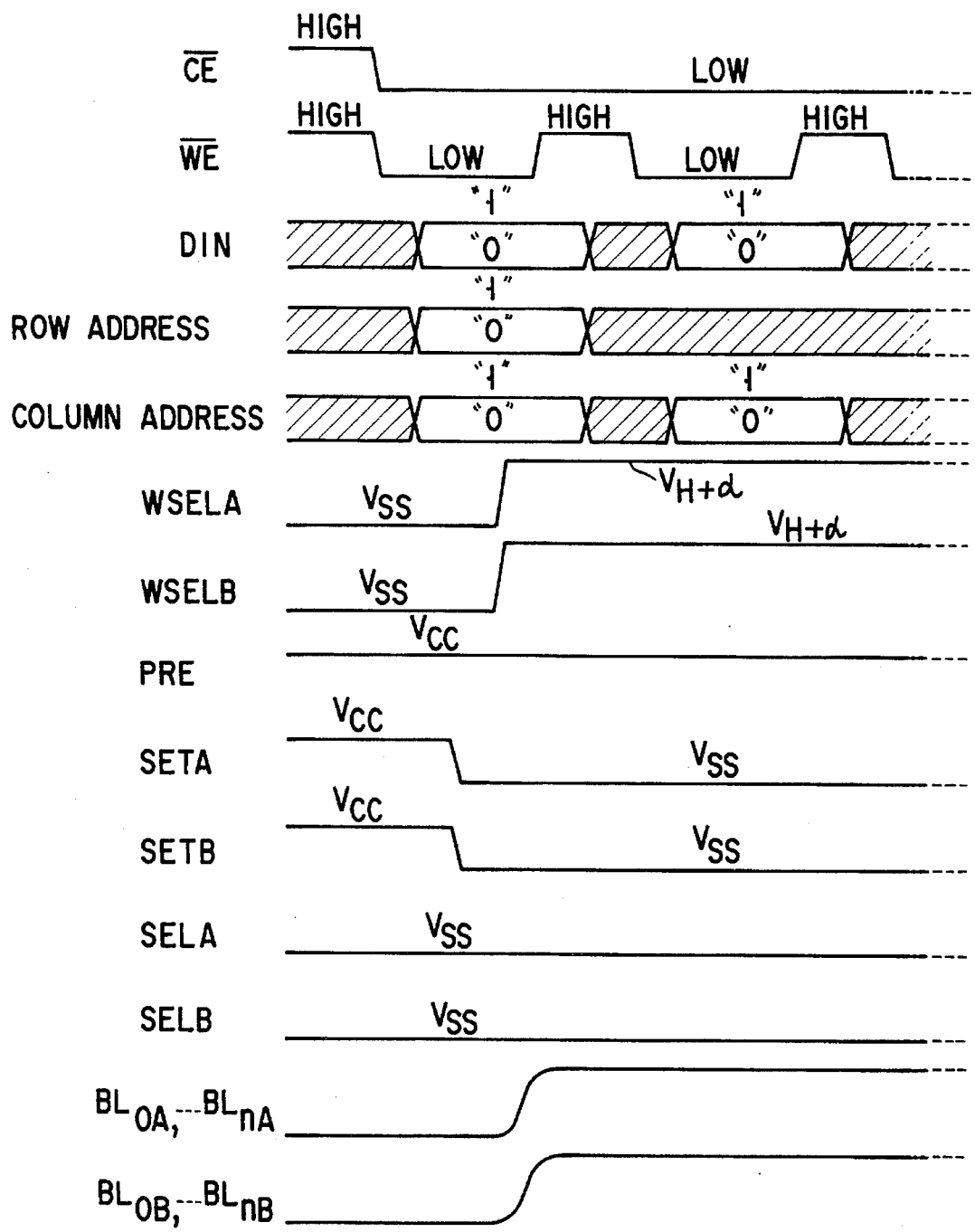
FIG. 20 is a timing chart of the first half of a write cycle of the EEPROM of the embodiment.

FIGS. 20 and 21 show the first half of a write cycle; and FIGS. 22 and 23, the latter half. In order to facilitate understanding of the timing of the write cycle, each of FIGS. 20 to 23 shows a chip enable signal CE, a write enable signal WE, input data Din, and row and column addresses.

When the chip enable signal and the write enable signal change from "H" level to "L" level, a write operation is started. In the first step, data from the input and output buffers are written in the sense amplifiers S/A0, ..., S/An through the input/output lines I/O and I/OB. More specifically, when the column selection signals $CSL_0$, $CSL_1$, ... are sequentially set at "H" level in accordance with the column address, as shown in FIG. 21, serial data are sequentially written in the sense amplifiers synchronously which these signal changes. If (n+1) sense amplifiers are arranged, this operation is repeated until data is written in the nth sense amplifier.

While this data write operation is performed with respect to the sense amplifiers, both write control signals WSELA and WSELB change from Vss to VH+', and all the bit lines BL are precharged to an intermediate potential $V_H$ higher than Vcc.

After the data is written in the nth sense amplifier S/An, one of the write control signals WSELA and WSELB is set at Vss in accordance with the row address. FIG. 22 shows a case wherein data are written on the odd bit lines $BL_{0A}$, ..., $BL_{nA}$. In this case, the control signal WSELA is set at Vss. As a result, the write charging transistors $Q_{04A}$, ..., $Q_{n4A}$ connected to the odd bit lines $BL_{0A}$, ..., $BL_{nA}$ are turned off. With this operation, the odd bit lines $BL_{0A}$, ..., $BL_{nA}$ are set at Vss (in a "1" data write operation) or $V_H$ (in a "0" data write operation) in accordance with the data transferred beforehand to the sense amplifiers S/A0, ..., S/An.

Subsequently, the selected word line $WL_{00}$ changes from Vss to a write potential Vpp, while the other word lines $WL_{01}$ to $WL_{07}$ and the selection gate line $SG_{D0}$ on the drain side change from Vss to $V_{H+}$'. Electron injection (a "1" data write operation) is performed with respect to the floating gates of the memory cells connected to bit lines, of the odd bit lines $BL_{0A}$, ..., $BL_{nA}$, which are set at Vss. During this period, all the even bit lines $BL_{0B}$, ..., $BL_{nB}$ are not set in a floating state but are fixed to the intermediate potential $V_H$ because the charging transistors $Q_{04B}$, ..., $Q_{n4B}$ are kept ON.

When a data write operation is to be performed with respect to the even bit lines $BL_{0B}$, ..., $BL_{nB}$, contrary to the above description, all the non-selected even bit lines $BL_{0A}$, ..., $BL_{nA}$ are fixed to the intermediate potential $V_H$ during the write operation.

During the above-described data write operation, the low potential BITL of each sense amplifier may be set to be Vss.

In the above embodiments, only the EEPROMs (electrically erasable programmable read only memories) are exemplified. However, the present invention can be effectively applied to ultraviolet-erasable type EPROMs.

As has been described above, according to the present invention, there is provided a highly reliable non-volatile semiconductor memory device which can achieve a great reduction in influence of capacitive coupling noise caused between adjacent bit lines in a data read/write operation.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A non-volatile semiconductor memory device comprising:
   a plurality of bit lines which are selected in accordance with an input address;
   a plurality of word lines arranged to intersect said bit lines;
   a plurality of erasable programmable non-volatile semiconductor memory cells respectively arranged at each intersecting position between said bit lines and said word lines and driven by said word lines to transfer data to said bit lines;
   a plurality of sense amplifiers, respectively connected to said bit lines, for detecting data of the memory cells selected by said word lines; and
   precharge means, connected to said bit lines and controlled by a control signal obtained by detecting an input address, for fixing non-selected bit lines at a predetermined potential,
   wherein said precharge means comprises a plurality of read charging transistors for setting the selected bit lines at a predetermined read potential to perform a data read operation, and a plurality of read discharging transistors for setting the non-selected bit lines at a ground potential during a read operation, said read charging transistors and said read discharging transistors being controlled by control signals, obtained by detecting change of the address, for every other bit line in accordance with the input address, and said read discharging transistors being kept ON to maintain said non-selected bit lines at the ground potential before and during a data read operation.

2. The device according to claim 1, wherein said non-volatile semiconductor memory cells are electrically erasable programmable non-volatile semiconductor memory cells which are connected in series so as to constitute units of a plurality of cells.

3. A non-volatile semiconductor memory device comprising:

a plurality of bit lines which are selected in accordance with an input address;

a plurality of word lines arranged to intersect said bit lines;

a plurality of erasable programmable non-volatile semiconductor memory cells respectively arranged at each intersecting position between said bit lines and said word lines and driven by said word lines to transfer data to said bit lines;

a plurality of sense amplifiers, respectively connected to said bit lines, for detecting data of the memory cells selected by said word lines; and precharge means, connected to said bit lines and controlled by a control signal obtained by detecting an input address, for fixing non-selected bit lines at a predetermined potential, wherein said precharge means comprises a plurality of write charging transistors for setting the selected bit lines at an intermediate potential to perform a data write operation, said write charging transistors being controlled by different control signals, obtained by detecting an address change, for every other bit line in accordance with the input address, said write charging transistors connected to the selected bit lines being turned off for a data write operation, and said write charging transistors connected to the non-selected bit lines being kept ON during the data write operation.

4. The device according to claim 3, wherein said non-volatile semiconductor memory cells are electrically erasable programmable non-volatile semiconductor memory cells which are connected in series so as to constitute units of a plurality of cells.

5. A non-volatile semiconductor memory device comprising:

a plurality of bit lines which are selected in accordance with an input address;

a plurality of word lines arranged to intersect with said bit lines;

a plurality of erasable programmable non-volatile semiconductor memory cells respectively arranged at each intersecting position between said bit lines and said word lines and driven by said word lines to exchange data with said bit lines;

a plurality of sense amplifiers, respectively connected to said bit lines, for detecting data of the memory cells selected by said word lines; and precharge means connected to said bit lines, for fixing the bit lines at least every other bit line at a predetermined potential in accordance with the input address, wherein said precharge means includes:

at least first and second pairs of control lines arranged to intersect said bit lines;

a plurality of first switching transistors arranged at a plurality of intersecting positions between said bit lines and said first pair of control lines at least every other bit line and connected to said bit lines and said control lines, for selectively connecting the bit lines connected to one of said first pair of control lines and those of the other to a data reading potential to perform a data read operation; and a plurality of second switching transistors arranged at a plurality of intersecting positions between said bit lines and said second pair of control lines at least every other bit line and connected to said bit lines and said control lines, for selectively connecting the bit lines connected to one of said second pair of control lines and those of the other to a shield potential lower than the data reading potential.

6. The device according to claim 5, wherein said non-volatile semiconductor memory cells are electrically erasable and programmable non-volatile semiconductor memory cells which are connected in series so as to constitute units of a plurality of cells.

7. The memory device according to claim 5, wherein said precharge means includes:

a pair of write control lines arranged to intersect said bit lines; and a plurality of write charging transistors arranged at a plurality of intersecting positions between said bit lines and said pair of write control lines at least every two bit lines and connected to said bit lines and said write control lines, for setting the selected bit lines at an intermediate potential to perform a data write operation, said write charging transistors being controlled by different control signals, obtained by detecting an address change, for every other bit line in accordance with the input address, said write charging transistors connected to the selected bit lines being turned off before a data write operation, and said write charging transistors connected to the non-selected bit lines being kept ON during the data write operation.

8. A non-volatile semiconductor memory device comprising:

a plurality of bit lines which are selected in accordance with an input address;

a plurality of word lines arranged to intersect said bit lines;

a plurality of erasable programmable non-volatile semiconductor memory cells respectively arranged at each intersecting position between said bit lines and said word lines and driven by said word lines to exchange data with said bit lines;

a plurality of sense amplifiers, respectively connected to said bit lines, for detecting data of the memory cells selected by said word lines; and precharge means connected to said bit lines, for fixing the bit lines at least every other bit line at a predetermined potential in accordance with the input address, wherein said precharge means includes:

a pair of write control lines arranged to intersect said bit lines; and a plurality of write charging transistors arranged at a plurality of intersecting positions between said bit lines and said pair of write control lines at least every two bit lines and connected to said bit lines and said write control lines, for setting the selected bit lines at an intermediate potential to perform a data write operation, said write charging transistors being controlled by different control signals, obtained by detecting an address change, for every other bit line in accordance with the input address, said write charging transistors connected to the selected bit lines being turned off before a data write operation, and said write charging transistors connected to the non-selected bit lines being kept ON during the data write operation.

9. The device according to claim 8, wherein said non-volatile semiconductor memory cells are electrically erasable programmable non-volatile semiconductor memory cells which are connected in series so as to constitute units of a plurality of cells.

10. A non-volatile semiconductor memory device comprising:

a plurality of bit lines which are selected in accordance with an input address;

a plurality of word lines arranged to intersect said bit lines;

a plurality of erasable programmable non-volatile semiconductor memory cells respectively arranged at each intersecting position between said bit lines and said word lines and driven by said word lines to transfer data to said bit lines;

a plurality of sense amplifiers, respectively connected to said bit lines, for detecting data of the memory cells selected by said word lines; and bit line shielding means, connected to said bit lines and controlled by a control signal obtained by detecting an input address, for fixing non-selected bit lines at a predetermined potential with respect to selected bit lines to electrically shield the selected bit lines;

wherein said non-volatile semiconductor memory cells are electrically erasable programmable non-volatile semiconductor memory cells which are connected in series so as to constitute units of a plurality of cells.

11. An erasable programmable non-volatile semiconductor memory device comprising:

a plurality of bit lines divided into at least first and second bit line groups, the bit lines of said first bit line group being alternately arranged;

a plurality of word lines arranged to intersect said bit lines;

a plurality of erasable non-volatile semiconductor memory cells respectively arranged at each intersecting position between said bit lines and said word lines, and driven by said word lines to transfer data to said bit lines;

a plurality of sense amplifiers connected to said bit lines, for detecting data from the memory cells selected by said word lines;

selection means for selecting one of said first and second bit line groups in accordance with an address input to said memory device;

precharge means for fixing the bit lines of the bit line group not selected by said selection means at a ground potential in at least a data reading mode;

a plurality of switching transistors connected between said bit lines and said sense amplifiers; and means for driving said switching transistors in pairs, wherein two adjacent switching transistors are connected to one or more of said sense amplifiers.

* * * * *